United States Patent
Goldbach et al.

(10) Patent No.: US 7,087,484 B2
(45) Date of Patent: Aug. 8, 2006

(54) METHOD FOR FABRICATING TRENCH CAPACITORS FOR INTEGRATED SEMICONDUCTOR MEMORIES

(75) Inventors: Matthias Goldbach, Dresden (DE); Jörn Lützen, Dresden (DE); Andreas Orth, Dresden (DE)

(73) Assignee: Infineon Technologies AG, Munich (DE)

( * ) Notice: Subject to any disclaimer, the term of this patent is extended or adjusted under 35 U.S.C. 154(b) by 324 days.

(21) Appl. No.: 10/616,396

(22) Filed: Jul. 9, 2003

(65) Prior Publication Data
US 2005/0118775 A1    Jun. 2, 2005

Related U.S. Application Data

(63) Continuation of application No. PCT/EP02/00102, filed on Jan. 8, 2002.

(30) Foreign Application Priority Data

Jan. 9, 2001    (DE) ................ 101 00 582

(51) Int. Cl.
*H01L 28/8242*    (2006.01)
(52) U.S. Cl. .................................... 438/243
(58) Field of Classification Search ................ 438/745, 438/705, 392, 387, 386, 270, 249, 243; 257/301, 257/296
See application file for complete search history.

(56) References Cited

U.S. PATENT DOCUMENTS

| 5,406,515 A | 4/1995 | Rajeevakumar |
| 5,658,816 A * | 8/1997 | Rajeevakumar ............. 438/386 |
| 5,692,281 A | 12/1997 | Rajeevakumar |
| 5,981,350 A | 11/1999 | Geusic et al. |
| 6,025,225 A | 2/2000 | Forbes et al. |
| 6,190,988 B1 | 2/2001 | Furukawa et al. |

FOREIGN PATENT DOCUMENTS

| DE | 100 55 711 A1 | 5/2002 |
| EP | 0 852 396 A2 | 7/1998 |
| EP | 0 903 782 A2 | 3/1999 |
| EP | 0 942 465 A | 9/1999 |
| EP | 0 967 643 A2 | 12/1999 |
| EP | 0 967 644 A2 | 12/1999 |
| WO | 00/67326 | 11/2000 |

* cited by examiner

*Primary Examiner*—Carl Whitehead, Jr.
*Assistant Examiner*—Monica D. Harrison
(74) *Attorney, Agent, or Firm*—Laurence A. Greenberg; Werner H. Stemer; Ralph E. Locher

(57) ABSTRACT

In a method for fabricating trench capacitors, in particular for memory cells having at least one selection transistor for integrated semiconductor memories, a trench for the trench capacitor is formed. The trench has a lower trench region, in which the capacitor is disposed, and an upper trench region, in which an electrically conductive connection from an electrode of the capacitor to a diffusion zone of the selection transistor is disposed. The method reduces the number of process steps for the fabrication of memory cells and enables fabrication of buried collars in the storage capacitors with an insulation quality as required for the fabrication of very large-scale integrated memory cells (<300 nm trench diameter).

31 Claims, 12 Drawing Sheets

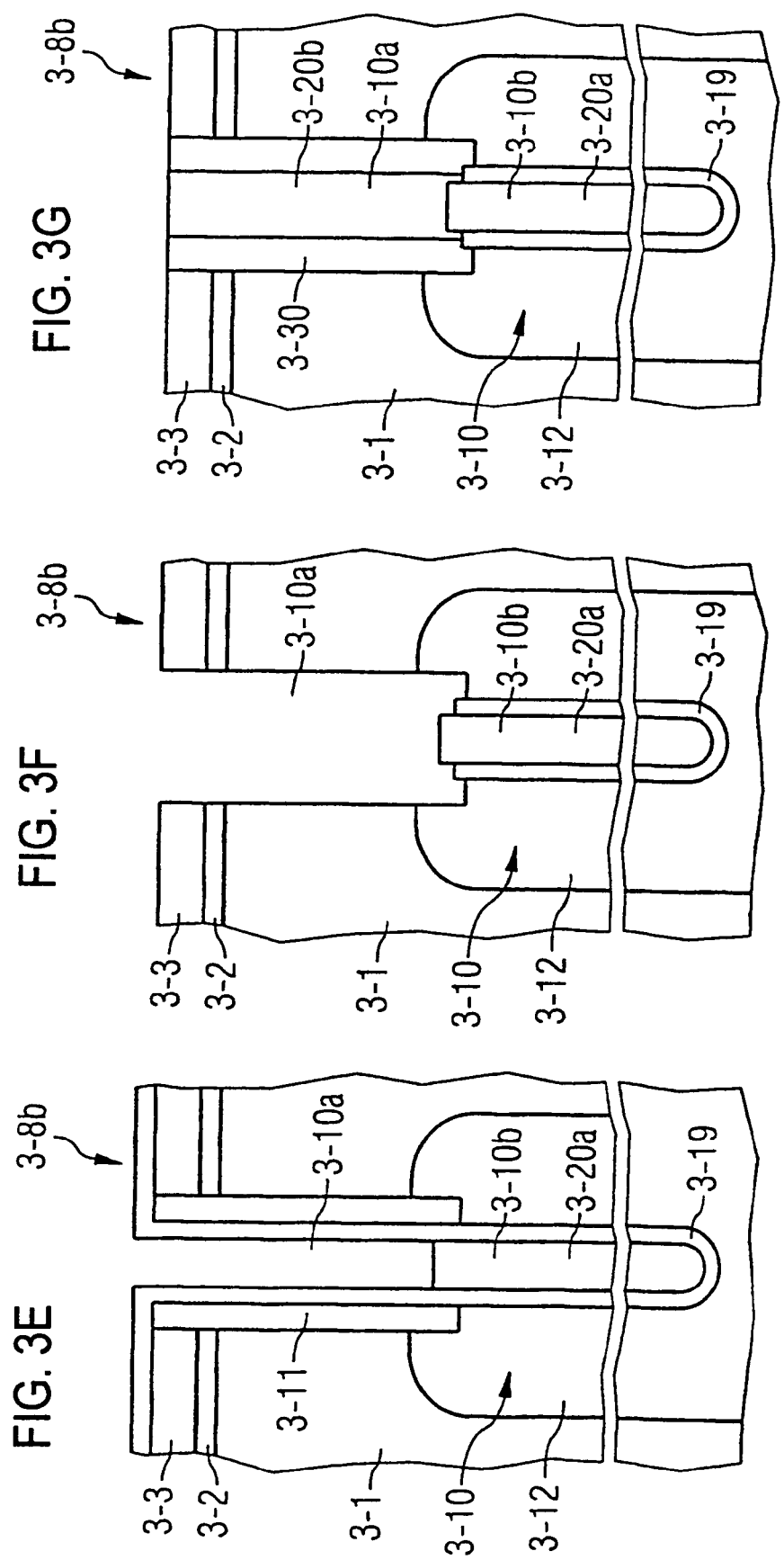

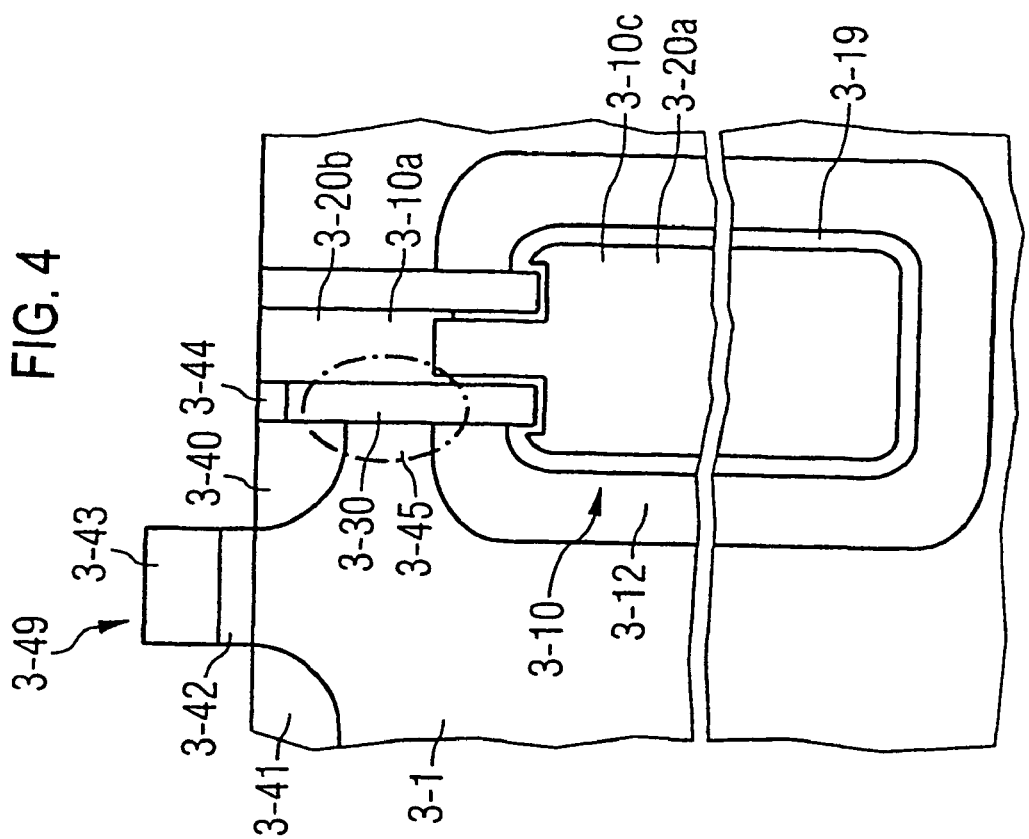
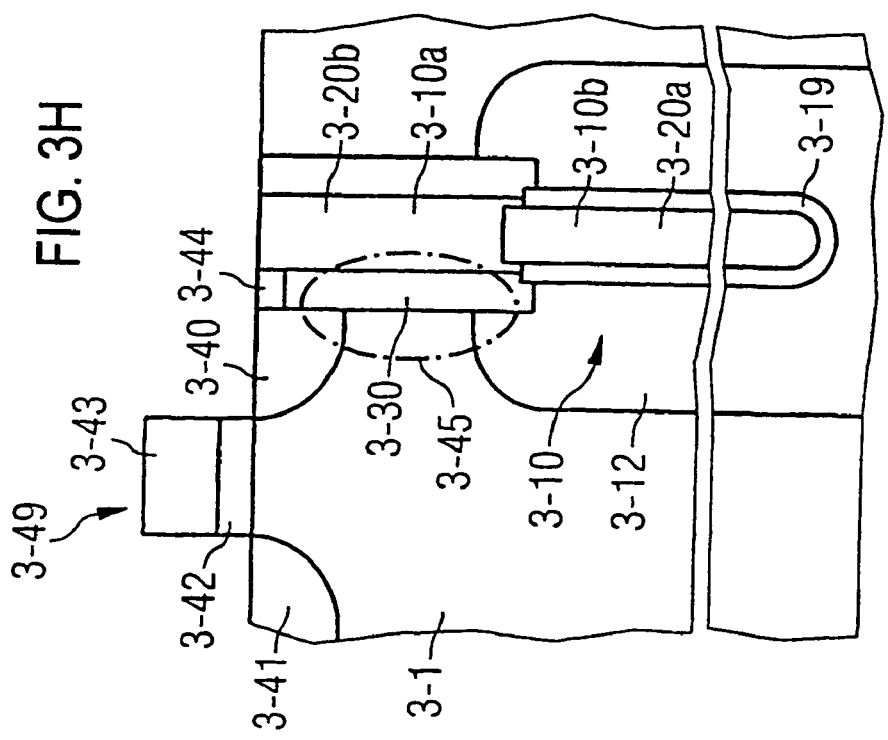

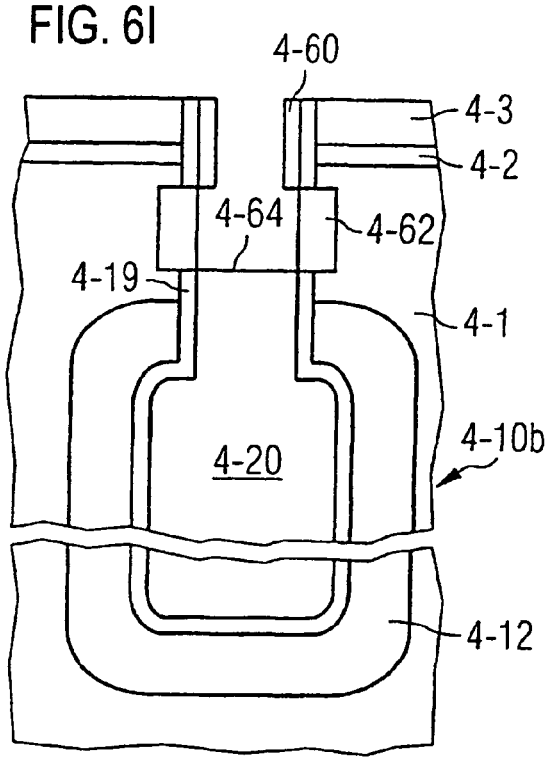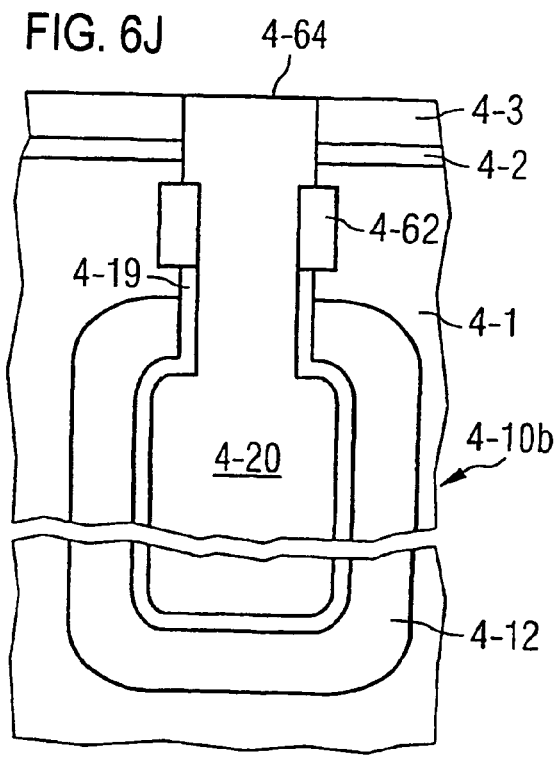

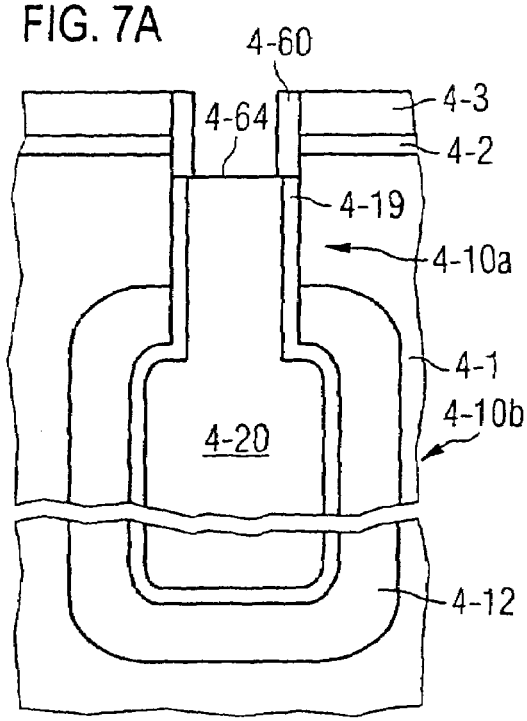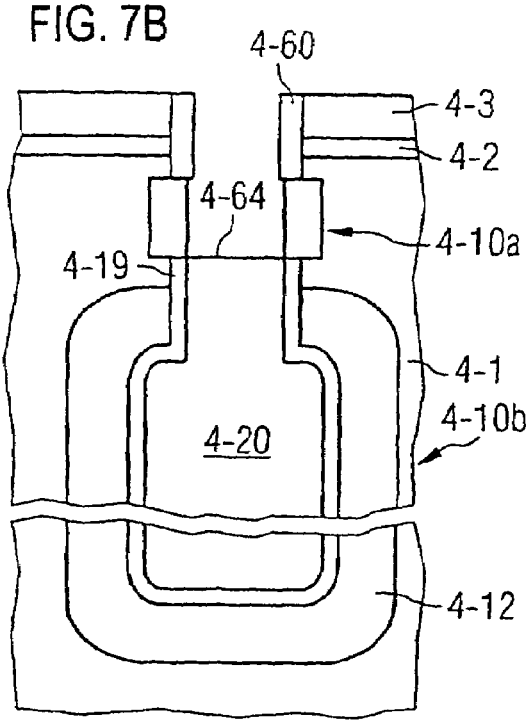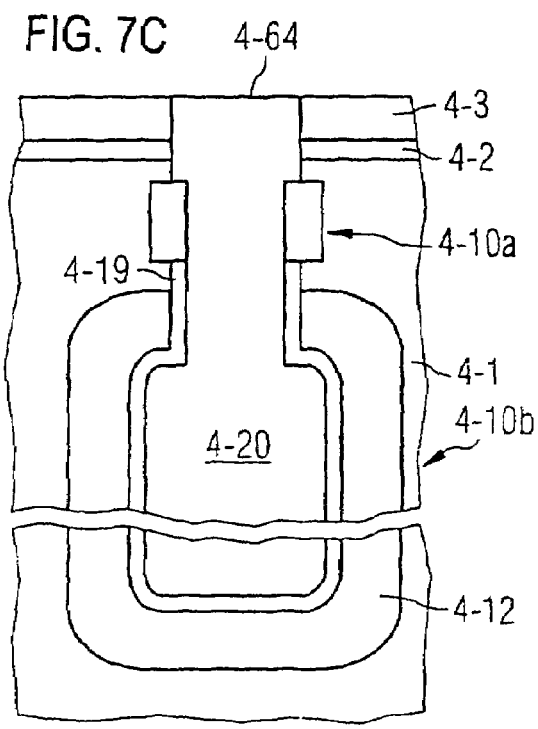

METHOD FOR FABRICATING TRENCH CAPACITORS FOR INTEGRATED SEMICONDUCTOR MEMORIES

CROSS-REFERENCE TO RELATED APPLICATION

This application is a continuation of copending International Application No. PCT/EP02/00102, filed Jan. 8, 2002, which designated the United States and was not published in English.

BACKGROUND OF THE INVENTION

Field of the Invention

The invention relates to a method for fabricating trench capacitors for integrated semiconductor memories.

The advancing miniaturization of circuits of semiconductor components leads to the demand for capacitors with the largest possible capacitance-to-volume ratio. Large-scale integrated semiconductor memories, in particular, require, for charge storage purposes, capacitors which have to provide a capacitance of at least about 30 fF in conjunction with a very small area requirement.

In addition to thinning the dielectric layer between the two capacitor electrodes and increasing the dielectric constant through the choice of new materials, in particular enlarging the surfaces of the capacitors in a predetermined volume leads to a larger capacitance-to-volume ratio.

A technique that has proved successful in the meantime for fabricating capacitors with a large capacitance-to-volume ratio is the production of capacitors in trenches that are produced in the semiconductor substrate. In this case, the surfaces of the trenches serve as large-area carriers of the electrode and dielectric layers. FIG. 1 shows a trench capacitor 1-1, which in the illustration, together with a selection transistor 1-2, forms a memory cell of a dynamic random access memory (DRAM) semiconductor component. Via the selection transistor 1-2, the trench capacitor 1-1 can be charged with electric charge or discharged, or the memory content can be "read". In this embodiment, the first electrode of the trench capacitor 1-1 is a buried layer 1-4, which is usually produced by doping walls of trenches 1-3, which are disposed close together, and ensures that the first electrodes of adjacent trench capacitors are connected to one another in a low-impedance manner. The first electrodes of such trench capacitors are therefore at a uniform reference potential. The dielectric layer 1-5 is applied on the walls of the trenches 1-3 and the second electrode 1-6 is applied on the dielectric layer 1-5, the second electrode 1-6 is usually formed of a doped polysilicon filling disposed in the trenches 1-3.

For reasons of saving space, the selection transistor 1-2 is disposed directly beside the trench capacitor 1-1, so that the second electrode 1-6 is conductively connected to a drain 1-8 of the selection transistor 1-2 via a short path by an electrically conductive strap 1-11 ("surface strap"). By switching a gate 1-10 of the selection transistor with the aid of a gate electrode 1-16, which is also called a word line, an electrical connection to a source 1-9 and thus to the bit line 1-15 is switched on or off. In this embodiment, the wiring plane of the bit line 1-15 is electrically insulated from the selection transistors 1–2 and the trench capacitors 1-1 by an oxide 1-17.

A problem zone of the memory cell type is a parasitic field-effect transistor 1-14 formed by the n-doped buried layer 1-4 with the n-doped drain 1-8 and the second electrode 1-6 as the gate. In this case, the gate oxide of this transistor is formed by the dielectric layer 1-5. If a voltage is present on the second electrode 1-6 on account of a stored charge, then the voltage on the other side of the dielectric layer 1-5 between the drain 1-8 and the buried layer 1-4 can produce channel leakage currents or an inversion layer which short-circuits the drain 1-8 and the buried layer 1-4 to one another. In this way, however, the trench capacitor 1-1 would be short-circuited and thus incapable of storing charge.

Channel leakage currents or an occurrence of an inversion layer in the parasitic transistor during operation of the semiconductor component can be suppressed by choosing a sufficiently high threshold voltage value $V_{thr}$ of the parasitic transistor 1-14. In this case, the threshold voltage value, $V_{thr}$, of the field-effect transistor can be increased by reducing the gate capacitance, e.g. by increasing the layer thickness of the dielectric layer.

However, a large layer thickness of the dielectric layer is at odds with the requirement of configuring the dielectric layer as thin as possible in the region of the capacitor for a maximum capacitance-to-volume ratio. In order to avoid this problem, the dielectric layer is usually produced with two different thicknesses. The dielectric layer 1-5 is applied predominantly thick in the region between the drain 1-8 and the buried layer 1-4 and predominantly thin in the region of the buried layer 1-4. The thick dielectric layer in the upper trench region is also called a collar 1-12. Furthermore, the fabrication of a dielectric layer with two different layer thicknesses has been technologically complex hitherto since it requires a multiplicity of additional process steps.

In principle, the gate capacitance of the parasitic transistor 1-14 can also be reduced by choosing a material that differs from the capacitor and has a low dielectric constant. However, applying different materials likewise requires additional process steps according to previous methods. Furthermore, when choosing the material, care must be taken to ensure that the new gate material enters into a layer junction with the silicon good enough to minimize the leakage current caused by lattice defects along the boundary layer between the drain 1-8 and the buried layer 1-4. For this reason, the collar 1-12 is usually produced by thermal oxidation of the silicon and subsequent oxide deposition.

The fabrication of trench capacitors with a collar for DRAM semiconductor memories according to the prior art is described diagrammatically in FIGS. 2A to 2F. In a first step (FIG. 2A), a thin oxide layer 2-2, which has the function of a pad oxide, a nitride layer 2-3 and a hard mask layer made of borosilicate glass (BSG layer) 2-4 are applied to a p-doped silicon wafer 2-1. Furthermore, photoresist is applied to the BSG layer 2-4 and patterned photolithographically to form a photoresist mask 2-6 in such a way that openings of the photoresist mask 2-6 reproduce a position and cross-section of trenches to be etched. In this case, the mask openings 2–5 typically have an oval or virtually round cross-section, so that in practice they are largely perceived as holes, as seen from above. In very large-scale integrated memory components, typical diameters of these openings are currently in the range of 100 nm to 500 nm. FIG. 2A shows the structure after the layer stack containing the pad oxide 2-2, the nitride layer 2-3 and the BSG layer 2-4 have been patterned in an anisotropic etching step, preferably using a dry etching gas 2-7 containing a first gas mixture. A hard mask has thus been fabricated which can be used to etch the trenches into the p-doped silicon wafer 2-1. The photoresist layer 2-6 is removed again after this patterning.

Trenches 2–15 are etched essentially selectively with respect to the BSG layer 2-4 in an anisotropic dry etching step, e.g. by an RIE etching step using a second dry etching gas 2-8 (FIG. 2B), in which case the depth of the trenches may be in the region of 5 μm or deeper. The BSG layer 2-4 is then removed again. The BSG layer 2-4 is removed wet-chemically.

In a further step, the sidewalls of the trenches 2–15 are coated with arsenosilicate glass 2-10 and an oxide layer, the arsenosilicate glass 2-10 keeping the arsenic available for the later n-type doping for producing the first electrode of the trench capacitors. In practice, the trenches are disposed so close together that the n-doped regions of adjacent trenches overlap, with the result that an n-doped layer, also called a buried layer, is produced from the n-doped regions. The buried layer thus serves as a common first electrode of the trench capacitors.

Since the buried layer must be electrically insulated from the p-doped zone—surrounding it—of the p-type silicon wafer and the selection transistors 1-2 on the surfaces of the silicon wafer, the buried layer must have a minimum distance of about 500 nm from the surface of the semiconductor substrate 2-1. For this reason, it is necessary to remove the arsenosilicate glass 2-10 in the upper trench region. This is done by filling the trenches 2-15 with photoresist 2-11 that is etched back. By subsequently etching the arsenic glass 2-10, the arsenic glass 2-10 is removed only in the region freed of the photoresist (FIG. 2C). The height of the partially removed photoresist thus prescribes the upper edge of the arsenosilicate glass layer 2-10 and thus the upper edge of a capacitor region 2-13 to be produced.

After the removal of the photoresist 2-11, a cap oxide is deposited and then the heat treatment step is carried out, by which the arsenic in the lower region of the trenches diffuses into the walls and a buried layer 2-16 is produced. The arsenosilicate glass 2-10 is then removed from the trenches. The buried layer 2-16 serves as the first electrode of the trench capacitor and as a electrically conductive connection between the first electrodes of adjacent trench capacitors.

There then follow the deposition of a dielectric layer 2-18, e.g. an oxide-nitride-oxide (ONO) layer, on the trench walls and the deposition of n-doped polysilicon 2-20a, which serves as the second electrode. As a result of a chemical mechanical polishing (CMP) step and a subsequent etching-back step, the dielectric layer 2-18 and the polysilicon 2-20a only remain in the trenches up to about 1 μm below the surface of the semiconductor substrate and below the upper edge of the capacitor region. The etching-back in the trenches now makes it possible to produce the collars above the etching-back (FIG. 2D).

An oxide layer is then deposited conformally and is subsequently etched anisotropically, so that the oxide layer only remains on the sidewalls of the upper trench regions and forms the collars 2-22 (FIG. 2E). The layer thickness of the collars is about 20 nm to 50 nm. Afterwards, the trenches 2-15 are filled with the upper polysilicon 2-20b again in order to be able to fabricate conductive connections to the selection transistors that are yet to be applied. In the further procedure, a selection transistor 2-24 with a drain 2-31, a source 2-32, a gate electrode 2-29 and a gate oxide 2-30 is applied beside the trench capacitor on the semiconductor substrate 2-1 and connected to the upper polysilicon 2-20b of the trench capacitors by an electrically conductive strap 2-33 (FIG. 2F).

The fabrication methods for storage capacitors have been complex hitherto, so that a considerable development effort is being undertaken in order to simplify the fabrication.

Furthermore, the different treatment of the trenches in the lower region (capacitor region), in which the buried layer and the thin dielectric layers are produced, and in the upper trench region, in which the collars are produced as thick dielectric layers, requires a multiplicity of additional process steps. For example, the capacitor region has to be filled with photoresist 2-11 in order that the arsenosilicate glass 2-10 can be etched away in the upper region, the photoresist then being removed again. Equally, the trench has to be filled with polysilicon 2-20, the polysilicon having to be removed again in the upper trench region in order that a collar can be produced in the upper trench.

Furthermore, the methods according to the prior art do not afford a simple possibility for introducing process steps for producing modified trench forms for increasing the trench surface areas in the capacitor region 2-13. For example, the method provides no possibility of interposing into the process sequence an additional isotropic etching of the trenches in the capacitor region 2-13 which would increase the trench diameter in the lower trench region. Even the production of mesopores in the capacitor region in accordance with Published, Non-Prosecuted German Patent Application DE 100 55 711 A, entitled "Method For Fabricating Trench Capacitors", could not be inserted into the process sequence, or could be inserted only in a laborious manner.

SUMMARY OF THE INVENTION

It is accordingly an object of the invention to provide a method for fabricating trench capacitors for integrated semiconductor memories which overcomes the above-mentioned disadvantages of the prior art methods of this general type, which extends the trench diameters in the lower trench region or produces mesopores in the lower trench region for the purpose of increasing the storage capacitance of the trench capacitors into the fabrication method in a simple manner.

The invention provides a method for fabricating trench capacitors for memory cells having at least one selection transistor for integrated semiconductor memories. The trench for the trench capacitor has the lower trench region, in which the capacitor is disposed, and the upper trench region, in which the electrically conductive connection from the electrode of the capacitor to the selection transistor is disposed. The method includes the steps of providing a semiconductor substrate of a first conductivity type, producing a horizontal mask on the semiconductor substrate, and carrying out an anisotropic etching step after a completion of the horizontal mask, thereby producing upper trench regions in the semiconductor substrate. The sidewalls of the upper trench regions are covered with vertical masks. The semiconductor substrate is etched selectively with respect to the horizontal mask and the vertical masks, for producing lower trench regions. Surfaces of the lower trench regions are doped with a material of a second conductivity type resulting in first electrodes being produced on surfaces of the lower trench regions. A dielectric is applied to the first electrodes and the vertical masks are removed. Second electrodes are applied to the dielectric resulting in trench capacitors being formed in the lower trench regions. The semiconductor substrate is etched in the upper trench regions after an application of the second electrodes. An insulator is produced on a region etched in each of the upper trench regions. Electrically conductive connections are produced and each connects a respective one of the second electrodes to a respective selection transistor.

Producing the vertical masks before producing the lower trench regions results in that the lower trench regions can be configured independently of the type of the upper trench regions. In this way, the lower trench regions can be etched without great complexity in any desired form as is required e.g. for maximizing the capacitance of the trench capacitors. By way of example, the lower trench regions can first be etched anisotropically, in order to achieve the largest possible trench depth, and can then be etched isotropically, in order to enlarge the trench diameters. Both maximize the surface of the lower trench regions and thus the capacitance of such a trench capacitor.

Furthermore, it is possible to carry out etching steps that roughen the surfaces of the trench walls in the lower trench region, which leads to an enlargement of the surface of the trench capacitors. Finally, it is also possible to etch mesopores for increasing the trench surface areas in the lower trench regions, as is described e.g. in Published, Non-Prosecuted German Patent Application DE 100 55 711 A. The upper trench region remains undamaged by these etching methods as long as the etching processes proceed selectively with respect to the horizontal mask and the vertical masks.

Furthermore, by the horizontal and vertical masks, it is possible to produce the first electrodes in the lower trench regions by doping, without requiring additional steps for covering the upper trench regions.

The method according to the invention furthermore makes it possible to configure the upper trench regions largely independently of the lower trench regions. By way of example, the second electrode can be applied to the dielectric with a layer thickness such that they afford sufficient chemical and mechanical protection of the lower trench regions, in particular the dielectric, during the patterning of the upper trench regions. In this way, the processing clearances for the patterning of the upper trench regions are significantly increased. This enables better compatibility with existing process step sequences, so that the method according to the invention can be incorporated into existing processing lines in a simple and thus cost-effective manner.

Furthermore, the larger processing clearances facilitate the fabrication of electrically conductive connections from the second electrodes to the selection transistors. Thus, it is possible to produce e.g. insulators ("collars") in the upper trench regions, which can suppress parasitic currents along the trench walls during operation. The parasitic currents would otherwise bring about an undesirable premature discharge of the trench capacitors. The larger processing clearances furthermore yield new parameter windows for reducing the size of the memory cell structures.

The method according to the invention is furthermore based on the vertical masks being removed. Since the vertical masks thus do not subsequently perform functionally critical tasks, e.g. as trench collar, the configuration of the upper trench regions is largely independent of the type and material of the vertical mask. As a result, the fabrication of suitable vertical masks is facilitated and larger processing clearances are possible. In particular, the method according to the invention opens up new possibilities for producing suitable insulators (e.g. "collars") and electrical connection elements between trench capacitors and selection transistors in the upper trench region, without these process steps having a relatively large influence on the lower trench regions.

The method according to the invention is advantageous in particular from the standpoint that the walls of the upper trench regions can be uncovered and replaced by suitable insulators, in particular "collars", after the production of the trenches. The insulators must have a layer thickness that is thick enough and a dielectric constant that is low enough to sufficiently suppress a capacitive coupling from the second electrode to the trench wall in the upper trench region. In this case, "sufficiently suppress" means that, during memory operation, at the boundary layer between insulator and semiconductor substrate, no conductive inversion layer is produced at the trench wall, which could discharge the first electrode ("parasitic transistor").

Furthermore, the removal of the vertical mask makes it possible to produce at the trench walls insulators that produce no leakage currents or only small leakage currents at the boundary layers between the semiconductor substrate and the insulators. Such leakage currents can discharge the first electrode and lead to the premature loss of the stored charges. Finally, the removal of the vertical masks enables the insulators to be produced so late in the upper trench regions that they have not been exposed to the preliminary processes such as gas phase deposition and nitriding, which damage the insulators.

The semiconductor substrate on which the memory cells are applied is preferably made of silicon, since the technologies for producing transistors and trench capacitors with very high integration density are available for this material. In principle, it is possible to fabricate the memory cells on semiconductor substrates with one or the other conductivity type. However, the memory cells are preferably fabricated on p-doped semiconductor substrate since the selection transistors thus have n-doped diffusion zones, which ensures a higher switching speed owing to the higher mobility of electrons in silicon (compared with holes as charge carriers).

The horizontal mask on the semiconductor substrate serves as a mask for producing the trenches in the semiconductor substrate for the trench capacitors. The horizontal mask is preferably produced from a layer stack by photolithographic methods. The layer stack must withstand in particular the etching steps for producing the trenches. The layer stack preferably has a nitride layer which may serve as a stop layer for the patterning of layers that are to be subsequently applied (e.g. CMP polishing stop).

In another preferred embodiment, the horizontal mask has a thick oxide layer, which preferably has a thickness of 1 to 2 µm. With such a horizontal mask (hard mask), it is possible to etch trenches with a large aspect ratio, e.g. greater than 40. As a result, it is possible to fabricate trench capacitors with a capacitance sufficient for charge storage on an extremely small area, e.g. with trench diameters of less than 300 nm, and preferably less than 100 nm.

The horizontal mask is preferably removed again in the course of the fabrication of the memory cells. The horizontal mask is preferably removed after the second electrode has in each case been applied to the dielectric. The horizontal mask is preferably removed by an HF wet etching step. If the second electrode is already applied on the dielectric before the etching step, then the etching advantageously has only a slight effect on the lower trench region. The effect of the etching on the lower trench regions is slight in particular when the trenches have been filled with the material of the second electrodes as far as an upper edge in the trench.

The openings of the horizontal mask, which serve for producing the trenches, are preferably largely round or oval in order thus to produce trenches with a largely round or oval cross section. For a predetermined cross-sectional area, largely round or oval cross sections can be fabricated technologically more simply and can be coated more easily in the inner region. The typical diameter of such cross-sectional areas preferably lies in the range from 20 nm to 500 nm.

After the completion of the horizontal mask, an anisotropic etching step is carried out, by which the upper trench regions are produced. The upper trench regions are etched anisotropically in order that the trenches, near the surface of the semiconductor substrate, occupy the smallest possible area on the surface of the semiconductor substrate, in order to be able to obtain the highest possible memory cell density. On the one hand, the depth of the upper trench region is to be chosen to be as small as possible, since this region cannot contribute to the total capacitance of the trench capacitor owing to the thick insulation towards the trench walls (collar oxide thickness). On the other hand, however, the depth of the upper trench region must be large enough to keep the capacitor far enough away from the surface of the semiconductor substrate that the capacitor and transistors disposed on the surface of the semiconductor substrate are adequately electrically insulated from one another. The upper trench region typically extends into the semiconductor substrate to a depth of about 1 µm.

Preferably, the horizontal mask is additionally undercut by a few to a few tens of nanometres, so that the vertical masks are produced set back by this distance at the trench walls. This ensures that, in the case of the oblique (funnel-shaped) etches of the horizontal mask, which are technologically difficult to avoid, horizontal surface regions of the semiconductor substrate are not uncovered by the etching step for producing the lower trench regions. Uncovered horizontal surface regions of the semiconductor substrate would represent areas of attack for undesired etchings outside the trenches.

The vertical masks for covering the sidewalls of the upper trench walls primarily serve for covering the upper trench region during the production of the capacitor in the lower trench region, so that the lower trench region can be etched by largely freely selectable methods in order to obtain a desired form. In this case, the sidewalls of the upper trench region preferably cover the vertical masks completely, so that no zone of the sidewalls in the upper trench region is exposed to the etching methods that are carried out in order to produce the lower trench regions.

In this case, a preferred method for producing the vertical masks is conformal deposition of a covering material followed by anisotropic etching. In this way, the covering material only remains at largely vertical side walls which completely cover the sidewalls of the upper trench regions. The covering material is preferably a nitride layer or a nitride/oxide layer ("NO layer"), which, in etching methods, yields a good selectivity with respect to silicon and a good diffusion barrier against gases fed in externally. Nitride layer or NO layer thus serve as preferably vertical masks for protecting the sidewalls of the upper trench regions during the production of the lower trench regions and during the doping for producing the first electrodes. The NO layer has better covering properties than a nitride layer during the etching of the deep trenches, so that the NO layer is preferred for the production of deep trenches. The thickness of the NO layer of the vertical masks preferably lies in the range between 10 nm and 30 nm; the NO layer preferably has a thickness of about 15 nm.

The lower trench regions are etched selectively with respect to the horizontal mask and selectively with respect to the vertical masks. The surface of the lower trench regions preferably serves as a bearing area of the capacitors. A maximally large surface of the lower trench regions therefore enables a maximally large capacitance of the trench capacitors. Since the integration density of memory cells is limited inter alia by the minimum capacitance, the etching of the lower trench regions is preferably carried out in such a way that a maximally large surface of the lower trench region is produced in the volume present for etching a lower trench region in the semiconductor substrate. In order that capacitances can be produced on the surfaces of the lower trench region, care must be taken to ensure that the surfaces are accessible for a subsequent coating with a dielectric material and an electrode material. For a reliable coating, the trenches and, if appropriate, also ramifications of the trenches must therefore have minimum diameters.

In a first preferred embodiment, the lower trench regions are therefore made as deep as possible since the surface of the trench capacitors grows linearly with the depth of the lower trench regions. In this case, the depth of the lower trench regions is limited only by the thickness of the substrate, which is typically in the region of a few hundred micrometres, and the technological feasibility of producing trenches with predetermined diameters of about 50 nm to 500 nm with large depths. Preferably, trenches with very large depths are produced largely by anisotropic etching, which can be used to produce trenches with aspect ratios of more than 30, and preferably more than 40.

In a second preferred embodiment, the lower trench regions are provided with the largest possible diameter, since the surface of the lower trench regions grows with the square of the diameter. Diameter in each case related to a representative diameter that is the diameter of a circle that matches the actual cross-sectional form of the trenches as well as possible. The maximum diameter of the lower trench regions is primarily limited by the density of the trench capacitors disposed on the semiconductor substrate, since the lower trench regions of adjacent trench capacitors must not touch one another. The density of the trench capacitors is in turn dependent on the density of the memory cells on the semiconductor substrate. The highest possible memory cell density is primarily limited by the cross section of the upper trench regions, the area of the selection transistors, the area required for insulating adjacent transistors, and possibly other components as well. The multiplicity of components required for a memory cell on the surface of the semiconductor substrate ensures that the cross section of the lower trench region can be significantly larger than the cross section of the upper trench region. In a preferred embodiment, the lower trench region is produced by anisotropic etching, which produces the required trench depth, and subsequent isotropic etching, which widens the lower trench region to the desired diameter of the trench cross-section.

In a third preferred embodiment, the surface areas of anisotropically or isotropically etched lower trench regions are increased by roughening the surfaces of the lower trench regions by suitable etchings. A method for producing rough surfaces for increasing the trench capacitor capacitances is described for example in U.S. Pat. Nos. 5,981,350 and 6,025,225.

In a fourth preferred embodiment, the surface areas of anisotropically or isotropically etched lower trench regions are increased by producing mesopores in the trench walls in the lower trench regions. The method for producing mesopores in trench capacitors is described for example in Published, Non-Prosecuted German Patent Application DE 100 55 711 A.

These are only a few examples of etching methods for producing the lower trench regions. In principle, what the method according to the invention makes possible by virtue of covering the upper trench regions with vertical masks and covering the surface of the semiconductor substrate with the horizontal mask is that any form of etching for producing the lower trench regions can be inserted into the process sequence in a simple manner as long as the etching is selective with respect to the horizontal mask and the vertical masks.

The surfaces of the lower trench regions are doped with material of the second conductivity type, so that a first electrode is in each case produced on the surfaces. The doping produces a surface that conducts in a low-impedance manner in the lower trench region, which surface, in the capacitor to be produced, assumes the function as a first electrode. Since the doping is of the opposite conductivity type to that of the semiconductor substrate, it is ensured that the first electrode can be electrically insulated from the circuit elements on the surface of the semiconductor substrate. As an alternative, an electrode layer made of metal is applied on the surfaces of the lower trench regions, which layer assumes the function of the first electrodes. This makes it possible to achieve a larger trench capacitance.

The doping of the surfaces of the lower trench regions is preferably carried out to the extent that the doped zones of adjacent trenches are electrically connected to one another in a low-impedance manner. This results in a layer that is doped in a low-impedance manner and connects all the first electrodes of the trench capacitors to one another (buried layer) and to which is applied a uniform reference voltage for the capacitors.

The doping for producing the first electrodes is preferably carried out in a gas phase doping process step that enables a uniform doping of the trench walls even in the case of deep trenches. In this case, doping is preferably effected using arsenic. The covering by use of the vertical masks and the horizontal mask ensures that only the lower trench region in each case is doped. This ensures that the buried layer lies only in the lower trench region and there is no ohmic conductive connection to the electrical circuits present at the surface of the semiconductor substrate, which circuits would in each case short-circuit the storage capacitors. Other doping methods are also conceivable, thus for example also the already described method with the aid of ASG coating with a subsequent thermal step (drive-in).

A dielectric is in each case applied to the first electrodes. Preferably, the dielectric in each case completely covers the surface of the first electrodes in the lower trench region. In order to obtain the highest possible capacitance for each trench capacitor, very thin layers made of a material having the highest possible dielectric constant are preferably provided as a dielectric. However, the minimum layer thickness is limited by the required dielectric strength that must be supplied by this layer for the voltage between the electrodes of a capacitor. Therefore, the dielectric is preferably an oxide-nitride-oxide (ONO) layer, a nitride-oxide (NO) layer or an oxide layer. These materials can be introduced uniformly according to known methods even in trenches with a large aspect ratio, i.e. with a large ratio of trench depth to trench diameter. Owing to the large dielectric constant, use is preferably also made of $Ta_2O_5$, $Al_2O_3$ or $Al_2O_3$ with additions containing e.g. hafnium, zirconium or ruthenium as the dielectric.

A second electrode is in each case applied to the dielectrics, so that the first electrode, the dielectric and the second electrode form a capacitor in each trench. The second electrode is composed of a conductive material and is preferably made of doped polysilicon or a metal. The second electrode preferably extends as far as the upper trench region, in order to produce the largest possible capacitance. The second electrodes are preferably produced by filling the trenches with the conductive material as far as the upper trench region. As a result, the dielectric of a lower trench region is completely covered in order to form the largest possible capacitance; furthermore, the usually thin dielectric is protected as well as possible against mechanical and chemical influences from the outside by the complete filling of the lower trench region. As an alternative, the second electrode can also be produced from a metal, e.g. from aluminum or one of the refractory metals such as tungsten, titanium or tantalum, the silicides thereof, TiN, or else a layer stack of these conductive materials. These materials have a smaller electrical resistance than polysilicon, with the result that the serial resistance during the reading-in and reading-out of, in particular, very deep trench capacitors is significantly reduced.

For the formation of the largest possible capacitance, it is unimportant whether or not voids are produced when the trenches are filled with the material of the second electrode. What is primarily important during the process of filling with material of the second electrode is that the first electrode covered with the dielectric is covered as extensively as possible with the material of the second electrode.

The vertical masks are preferably removed by an etching step by wet etching using HF glycol or hot phosphoric acid. In a first preferred embodiment, the vertical masks are removed after the application of the second electrodes to the dielectric. As a result, the lower trench regions, in particular the dielectric, are protected against damaging effects during etching.

In this case, the trenches are filled up to a level in the upper trench region at which the vertical masks can later be removed in a simple manner and in each case replaced by an insulator (collar). The insulators serve, as part of the gate, for putting the threshold voltage $V_{thr}$ of the parasitic transistor at a magnitude such that the channel leakage currents are minimized during semiconductor memory operation and an inversion cannot arise in the transistor channel. The process of filling with the conductive material as far as the upper trench region is preferably achieved by a conformal coverage of the trenches with the conductive material and subsequent etching-back to the desired level in the trench.

In another preferred embodiment, the vertical masks are removed before the application of the dielectric. In this case, the dielectric that is subsequently to be applied covers the entire trench wall region, in particular also the upper trench region. This method enables a simplification if it is a matter of fabricating "buried collars" in the upper trench region. In this case, it is possible to utilize the dielectric in the upper trench region as a protective shield for the progressive etching-back of the second electrode, which is preferably made of polysilicon. The progressive etching-back is preferably carried out for the definition of the "buried collar" region.

Finally, an electrically conductive connection from the second electrode to the selection transistor is produced. The electrically conductive connection is preferably led to one of the diffusion zones of the selection transistor. The selection transistor preferably serves for insulating the trench capacitor for memory purposes or for being able to enable it for charging, discharging or reading-out. Charging and discharging are affected in each case via the electrically conductive connection. For reasons of saving space, the diffusion zone of the selection transistor that is connected to the trench capacitor via the electrically conductive connection is preferably disposed closely beside the trench capacitor on the surface of the semiconductor substrate.

The electrically conductive connection from the second electrode to the diffusion zone can be effected in many ways. In a first preferred embodiment, the electrically conductive connection is produced by filling the trench with a conductive material as far as the surface of the semiconductor substrate and fabricating an electrically conductive strap ("surface strap") which, running on the surface of the semiconductor substrate, conductively connects the conductive material of the trench capacitor to the diffusion location of the selection transistor.

In a second preferred embodiment, the trench is filled only to just below the surface of the semiconductor substrate, so that it is possible to produce the electrically conductive strap to the diffusion zone below the surface of the semiconductor substrate ("buried strap"). An even greater packing density can be produced using this method. However, the invention is not restricted to these two methods, but rather encompasses all electrically conductive connections that produce a connection between the diffusion location and the second electrode.

In a preferred embodiment, the vertical masks are replaced by insulators, preferably with a low dielectric constant, preferably after the production of the second electrodes. Low dielectric constant is to be understood as, in particular, a value that is less than the value of the dielectric constant of the material of the vertical masks. In this way, for a given layer thickness, the capacitance per unit area of the gate of the parasitic transistors is lowered and the threshold voltage for turning on the transistor channel current is increased. In this case, the threshold voltage must reach a minimum threshold voltage value that ensures that the parasitic transistor has sufficiently small leakage currents during the operation of the semiconductor memory. Equally, given a small dielectric constant, the layer thickness of the insulators can be chosen to be smaller, which complies with the endeavor for the smallest possible cross sections of the trench capacitors.

In the choice of the material for the insulators, it should be ensured that the material forms, with the semiconductor substrate material, a junction that is as far as possible free of lattice imperfections, in order to minimize leakage currents in the transistor channel along the boundary region between the insulator and the semiconductor substrate. Such leakage currents can likewise discharge the trench capacitors and render charge storage impossible. For a junction free of lattice imperfections, $SiO_2$—Si junctions, in particular, are preferably chosen, the $SiO_2$ preferably being produced thermally. Therefore, in a preferred embodiment, the insulator is produced with the aid of thermal oxidation of the sidewalls of the upper trench regions.

Furthermore, an oxide layer is preferably deposited onto the oxidized sidewalls in order to produce an insulator layer thickness that is predetermined for a sufficiently high threshold voltage. In this case, the predetermined layer thickness is derived from the maximum capacitance per unit area that is required for achieving a minimum threshold voltage on the parasitic transistor.

The production of the insulators on the sidewalls of the upper trench regions is preferably done by producing a layer made of the insulator material and subsequent anisotropic etching which leaves behind the insulator material only on the largely perpendicular surfaces and, in particular, on the walls of the perpendicular upper trench regions.

Insulators are preferably produced after the removal of the vertical masks on the semiconductor substrate in the upper trench region. The insulators ("collars") preferably serve for electrically insulating the second electrodes in the upper trench region from the semiconductor substrate. In this way, it is possible to route an electrically conductive connection between the second electrode and the associated selection transistor via the upper trench region. The insulators must preferably have a sufficient layer thickness. The sufficient layer thickness of the insulators is required for increasing the threshold voltage of the parasitic transistor, in order to avoid an undesirable loss of charge of the storage capacitors during memory operation.

The insulators are preferably produced after the doping of the surfaces of the lower trench regions, since, in this way, the insulators are not exposed to the damaging effects of a doping, e.g. of a gas phase doping (GPD) process. Insulators functioning as "collars" which electrically insulate the second electrode from the semiconductor substrate must have a junction layer that is as far as possible free of defects with respect to the semiconductor substrate, in order that no leakage currents are generated in the junction region. In order to have a good junction layer with respect to the semiconductor substrate, it is advantageous, therefore, that the insulators are exposed to the fewest possible process steps such as doping, etching, etc.

The semiconductor substrate is preferably etched in the upper trench region after the application of the second electrode and before the production of the insulator. The etching leads to an enlargement of the cross section in at least one part of the upper trench region. The enlargement of the cross section in the upper trench region preferably serves for providing space for insulators or "collars" with a sufficient layer thickness in the upper trench regions, without bringing about an additional constriction or a closure of the upper trench region. Particularly in the fabrication of very large-scale integrated trench capacitors with trench diameters of less than 300 nm or preferably less than 100 nm, an additional constriction in the upper trench region would make it more difficult to subsequently fill the trenches with a material, in particular with the material of the second electrode (e.g. polysilicon).

The etching in the upper trench region of the semiconductor substrate after the filling of the trenches can, but need not, be conducted selectively with respect to the material of the second electrode, e.g. polysilicon. Since the etching of the semiconductor substrate in the upper trench region is conducted only to a depth of a few 10 nm, it is generally unimportant whether or not the material of the second electrode is concomitantly etched, which material extends into the semiconductor substrate to a depth of several μm.

The etching in the upper trench region is preferably carried out selectively with respect to a second liner, which is preferably a nitride layer, a nitride/oxide layer or an oxide layer. The second liner protects the upper region of the upper trench region preferably as far as the upper edge of the trench, thereby preventing enlargement of the cross section of the trench at the upper edge of the trench. Such enlargement would increase the area requirement of the trench capacitors on the main surface of the semiconductor substrate.

Furthermore, the second liner ensures that the etching in the upper trench region is carried out with a well-defined distance with respect to the main surface of the semiconductor substrate. On the one hand, this leaves a region in the upper trench region unetched, which is required for producing an electrically conductive connection between selection the transistor and the second electrode, e.g. in the form of a "surface strap" or a "buried strap". On the other hand, it becomes possible to produce a "buried collar" with a sufficient distance with respect to the main surface of the semiconductor substrate, so that the "buried collar" does not impair the function of electrical components, e.g. the selection transistor, on the main surface of the semiconductor substrate. A higher integration density of the memory cells is possible in this way.

The semiconductor substrate is preferably opened for performing an etching process in the upper trench region by the following steps:

a) filling the trenches with the material of the second electrode, preferably as far as the upper edge of the semiconductor substrate;

b) etching-back the material of the second electrode as far as a first etching-back step within the upper trench region;

c) covering the trench walls above the first etching-back step with a second liner;

d) etching-back the material which preferably lies within the upper trench region; and e) opening the semiconductor substrate selectively with respect to the second liner.

The opening method makes it possible to etch the semiconductor substrate in a well-defined region within the upper trench region, namely between the first etching-back step and the second etching-back step.

The insulator ("buried collar") is preferably produced on the zone etched in the upper trench region, preferably between the first etching-back step and the second etching-back step. This configuration of the insulator counteracts constriction of the upper trench regions. Furthermore, the etching in the upper trench region makes it possible, without trench constriction, to produce an insulator with such a large layer thickness in the upper trench region that the threshold voltage of the parasitic transistor at the upper trench region is put so high that no parasitic transistor currents can discharge the storage capacitor.

In a preferred embodiment, the second liner is applied to the dielectric. As a result, the dielectric need not be removed before the production of the buried collars. At the same time, the dielectric and the second liner together form, e.g. in the form of an NO layer, a good covering during the etching of the semiconductor substrate in the upper trench region.

In another preferred embodiment, the second liner is applied to the semiconductor substrate. In this case, it is necessary to remove the dielectric before the application of the second liner at least in the open regions. However, a later step for removing the dielectric is obviated. Given a sufficient thickness, the second liner affords, also as a single layer, sufficient protection during the selective etching of the semiconductor substrate in the upper trench region.

In a third preferred embodiment, the second liner is applied to the dielectric and then converted into an oxide, preferably by an in situ steam generator (ISSG) process step. If the dielectric is an NO layer, then an oxide layer is produced from the liner-NO layer combination by the ISSG process step. The oxide layer thus produced can be replaced like the second liner as masking for the etching of the semiconductor substrate in the upper trench region, so that the subsequent process steps differ only insignificantly from those with a second liner.

Other features which are considered as characteristic for the invention are set forth in the appended claims.

Although the invention is illustrated and described herein as embodied in a method for fabricating trench capacitors for integrated semiconductor memories, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 3A–3H are diagrammatic, sectional views showing an embodiment of a method according to the invention for fabricating the memory cell with the trench capacitor and the selection transistor;

FIG. 4 is a diagrammatic, sectional view of the trench capacitor according to the invention with an extended trench in a capacitor region;

FIGS. 6A–6J are diagrammatic, sectional views showing a second embodiment of the method according to the invention for fabricating the memory cell with the trench capacitor and the selection transistor, the trench capacitor having a "buried collar"; and FIGS. 7A–7C are diagrammatic, sectional views showing a third embodiment of the method according to the invention for fabricating the memory cell with the trench capacitor and the selection transistor, the trench capacitor having a "buried collar".

DESCRIPTION OF THE PREFERRED EMBODIMENTS

Figure 1:
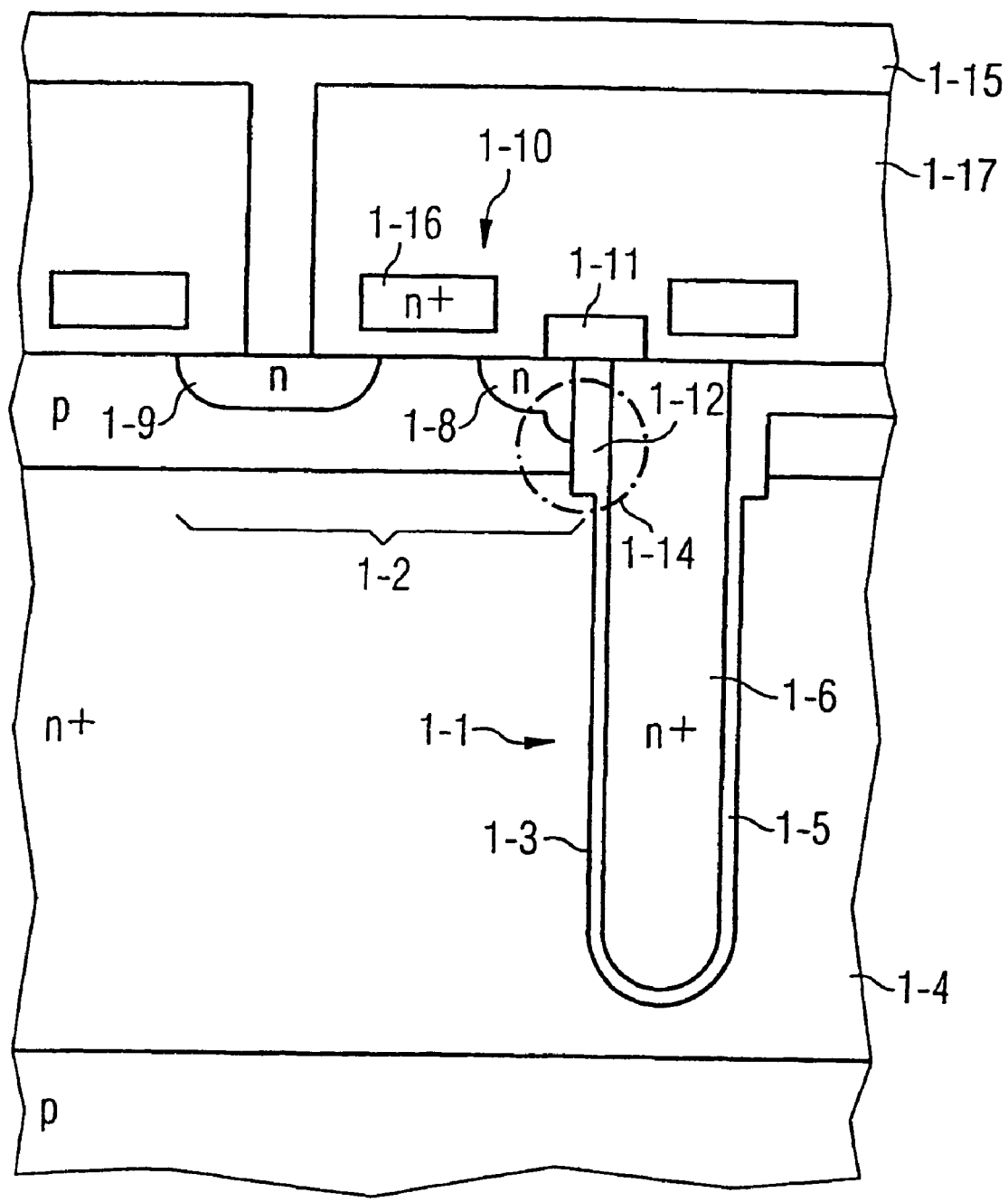
FIG. 1 is a diagrammatic, sectional view of a memory cell with a trench capacitor and a selection transistor according to the prior art.
Figure 2A:
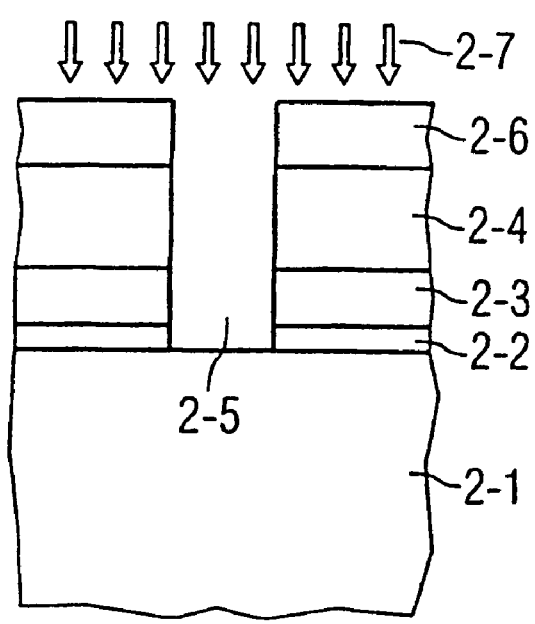
FIGS. 2A–2F are diagrammatic, sectional views illustrating a method according to the prior art for fabricating a memory cell with the trench capacitor and the selection transistor.
Figure 2B:
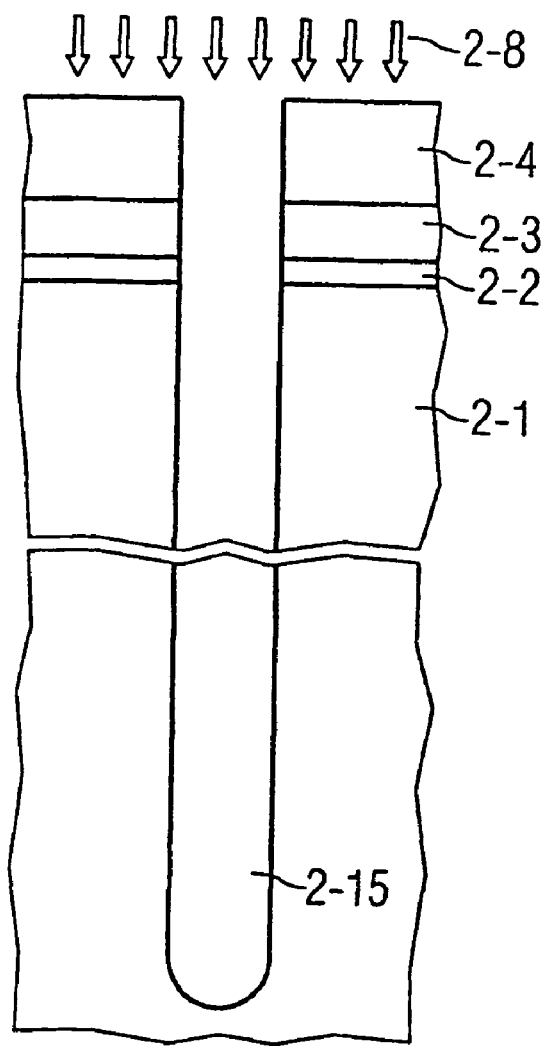
Figure 2C:
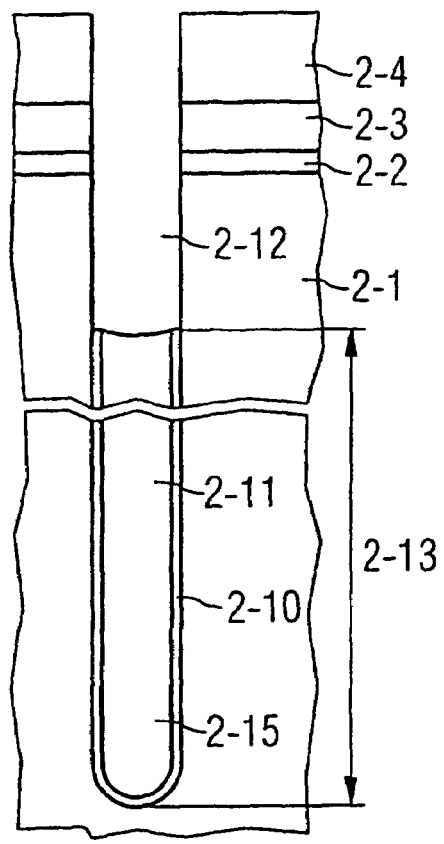
Figure 2D:
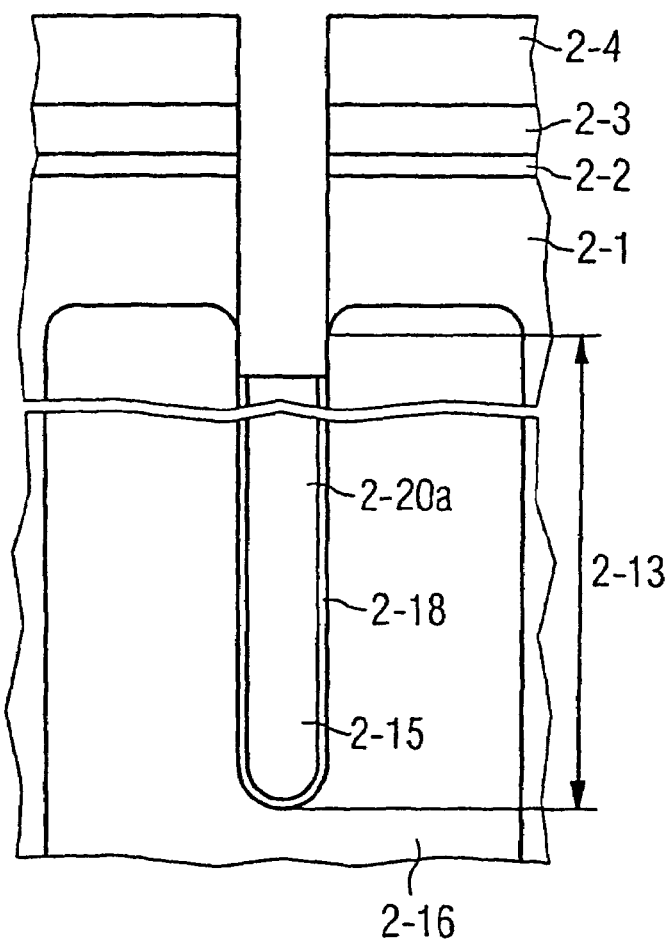
Figure 2E:
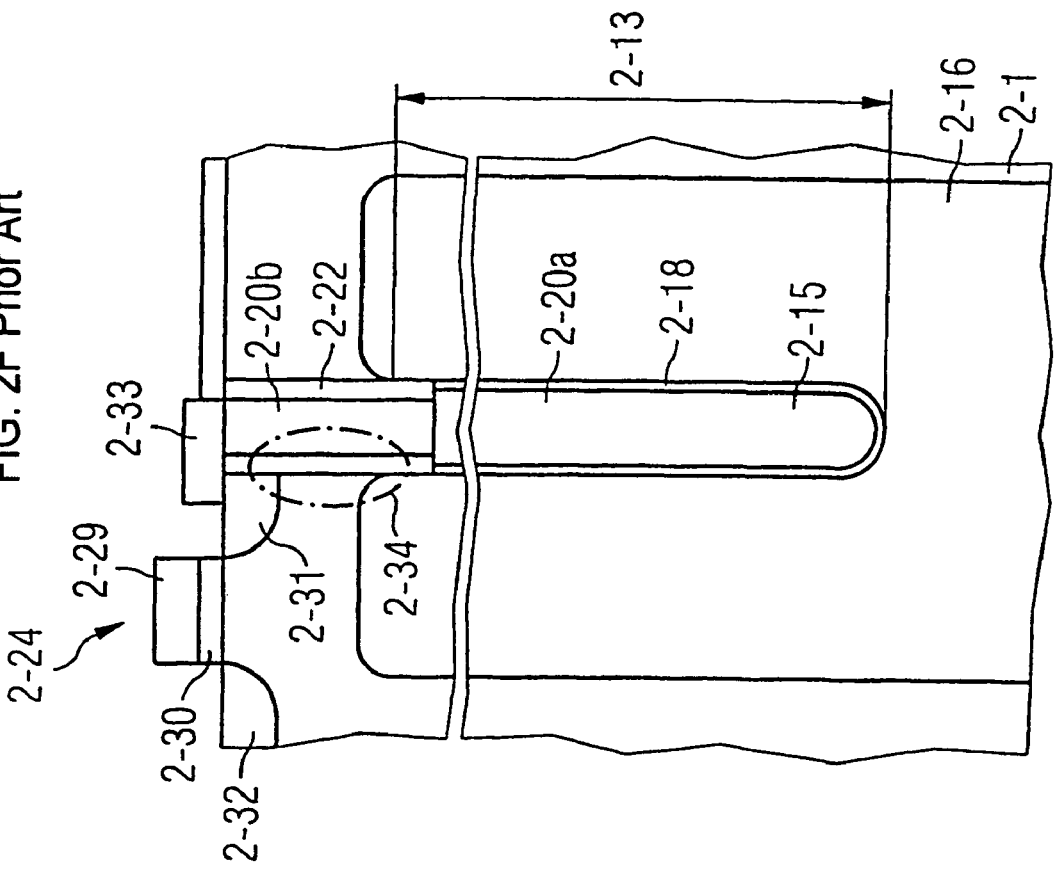
Figure 2F:
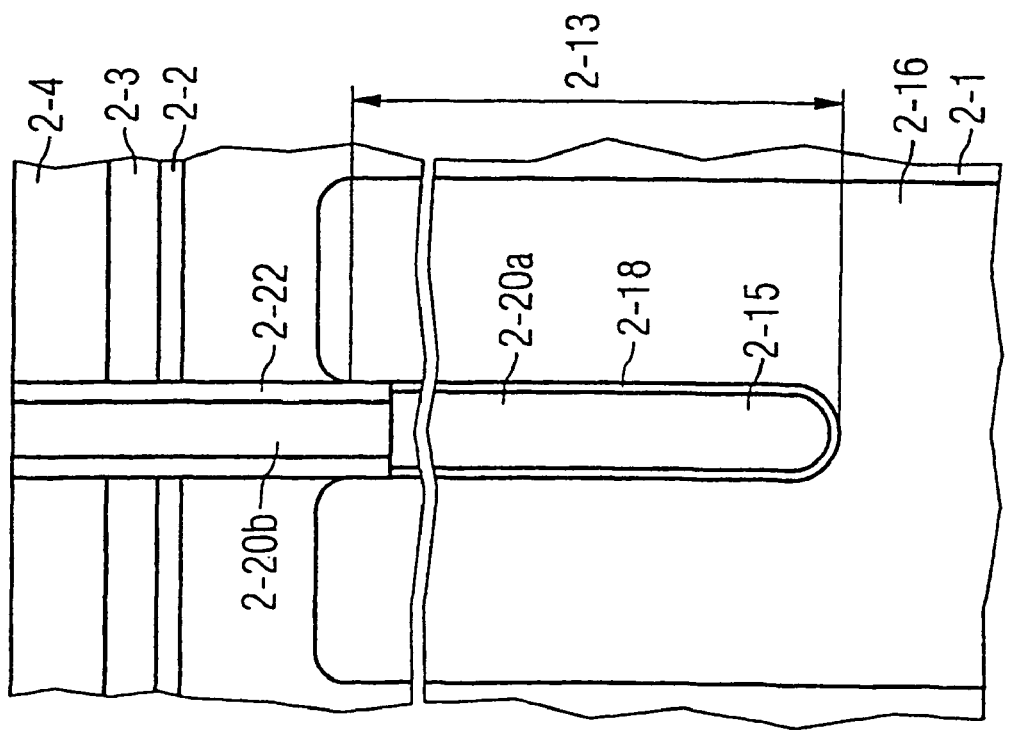

Referring now to the figures of the drawing in detail and first, particularly, to FIGS. 3A–3H thereof, there is shown an embodiment of a method according to the invention for fabricating memory cells with trench capacitors and selection transistor.

Figure 3A:
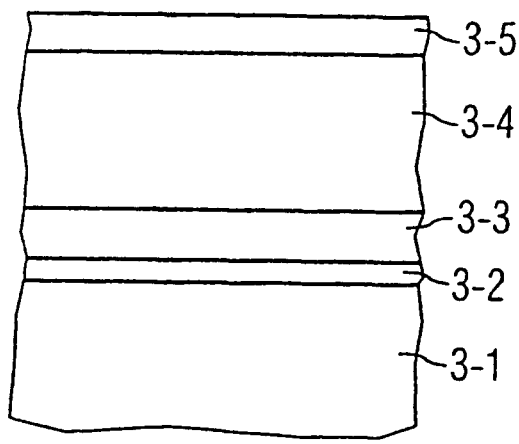

FIG. 3A shows a semiconductor substrate 3-1, which is a p-doped silicon wafer in this embodiment, with an applied layer stack containing a thin pad oxide 3-2, a nitride layer 3-3, an oxide 3-4 having a thickness of about 1 μm to 2 μm, and a polysilicon layer 3-5 having a thickness of 200 nm to 300 nm. A TEOS layer 3-4 may also contain other oxides, e.g. silane oxide.

Figure 3B:
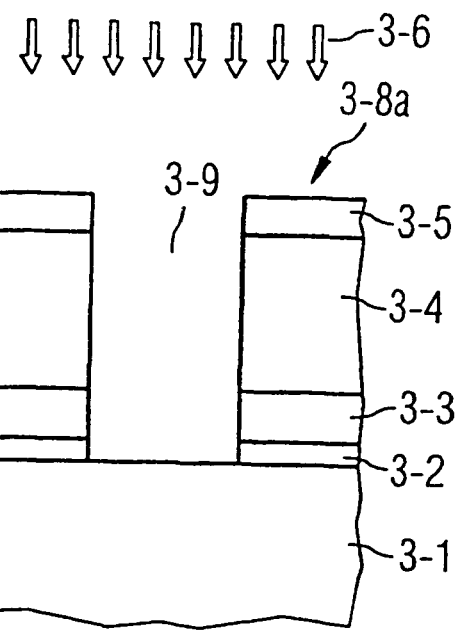

Afterwards, the polysilicon layer 3-5 is patterned with the aid of a standard photolithographic method that prescribes the structure, position and cross section of the trenches to be produced for the trench capacitors in the semiconductor substrate 3-1. Afterwards, a first horizontal mask 3-8a is produced selectively with respect to the polysilicon layer 3-5 by an anisotropic etching step, preferably using a dry etching gas 3-6, through the TEOS oxide 3-4, the nitride layer 3-3 and the pad oxide 3-2. In this case, the etching preferably extends about 10 nm to 20 nm into the silicon, in order to ensure, in the open mask region, a complete breach through the nitride layer 3-3 and the pad oxide 3-2 (FIG. 3B). The first horizontal mask 3-8a is also called a hard mask.

There follows the anisotropic etching, preferably in a dry etching step, for producing an upper trench region 3-10a selectively with respect to the first horizontal mask 3-8a. The upper trench region 3-10a typically projects into the p-doped silicon to a depth of about 500 nm to 1500 nm. The polysilicon layer 3-5 is largely or completely removed after the anisotropic etching.

In order to produce vertical masks, a silicon nitride layer having a thickness of about 15 nm is subsequently applied and etched anisotropically. As a result of the anisotropic etching, only the approximately vertically running layer elements of the silicon nitride layer remain in the trenches, which layer elements are depicted as vertical masks 3–11 in FIG. 3C. The thickness of the vertical masks of about 15 nm suffices for protecting the upper trench regions against process steps such as gas phase doping (doping of the lower trench regions), production of mesopores, and production of extended trench regions by isotropic etching. The vertical masks additionally protect the layers of the horizontal mask 3-8a in the trench region during the etchings. The pad oxide 3-2, in particular, is sensitive e.g. to wet-chemical etching steps with which the TEOS oxide 3-4 is later to be removed.

As an alternative to the silicon nitride layer for producing the vertical mask 3-11, it is also possible to use a silicon oxide/silicon nitride layer having a thickness of about 15 nm. During the anisotropic etching for producing the lower trench regions, such a silicon oxide/silicon nitride layer has a better durability than nitride alone and is therefore the preferred method.

In order to produce the silicon oxide/silicon nitride layer, it is preferable first for a nitride layer having a thickness of about 10 nm to be deposited conformally in an LPCVD process (temperature 715° C. in an $NH_3/SiH_2Cl_2$ gas mixture at a pressure of 170 mTorr, duration 14 minutes). Accordingly, there are various possibilities.

In a first preferred method step, approximately half of the nitride is converted into silicon oxide in an in situ steam generation (ISSG) method at a temperature of 900° C. ($O_2$ atmosphere with 33% $H_2$ component, pressure: 10.5 Torr, duration: maximum 120 seceonds), thereby resulting in an NO layer with a nitride layer having a thickness of about 5 nm and a silicon oxide layer having a thickness of about 9 nm.

In a second preferred method step, the nitride is treated in a LOCOS method step at about 1050° C. (10,000 sccm $O_2$ flow, duration about 16.5 minutes), so that the monitor indicates an oxide layer having a thickness of about 35 nm (oxide on monitor). In this way, the nitride layer is converted into a nitride layer having a thickness of about 7 nm with, lying thereon, an oxinitride layer having a thickness of 5 nm.

In a third preferred method, amorphous silicon is deposited at 500° C. at 200 mTorr and with a gas flow of 120 sccm $SiH_4$ for about 39 minutes. An oxidation step may then be affected.

Through one of these methods, either a silicon/silicon nitride layer or a silicon oxide/silicon nitride layer with a thickness of about 10 to 20 nm is obtained. This is followed by anisotropic etching by which the horizontal layer elements are removed and only the vertically running layer elements remain. The vertical silicon oxide/silicon nitride elements that have remained are shown as vertical mask 3-11 in FIG. 3C.

Lower trench regions 3-10b can now be produced with the aid of an anisotropic etching step according to the prior art selectively with respect to the first horizontal mask 3-8a and selectively with respect to the vertical masks 3-11. The etching step typically extends into the semiconductor substrate to a depth of 5 μm to 10 μm. However, the depth is not fixed at a value, so that it is also possible to produce significantly deeper trenches 3-0 (FIG. 3D). As a result of the anisotropic etching step, the TEOS oxide layer 3-4 becomes distinctly thinner, depending on the depth of the lower trench regions.

For technological reasons, opening edges of the first horizontal mask 3-8a often do not run perpendicularly, but obliquely or in a funnel-shaped manner. Funnel-shaped opening edges can have the consequence that the thickness of the first horizontal mask 3-8a in the funnel-shaped region does not suffice for protecting the underlying semiconductor substrate 3-1 during the anisotropic etching of the lower trench regions 3-10b. In this case, horizontal surface regions of the semiconductor substrate 3-1 are opened, so that etchings which are intended for producing large surfaces in the lower trench regions 3-10b also unintentionally etch horizontal surface regions of the semiconductor substrate 3-1. In order to avoid the unintentional etchings at the horizontal surface regions of the semiconductor substrate 3-1, an isotropic etching step which widens the upper trench regions 3-10a is preferably carried out before the anisotropic etching of the lower trench regions 3-10b. The widening depends on the inclination of the opening edges and may lie in the range from 5 nm to 50 nm. The oblique opening edges of the first horizontal mask 3-8a are accordingly undercut. After the application of the vertical masks 3-11, it is thus possible to ensure during the anisotropic etching of the lower trench regions 3-10b that horizontal surface regions of the semiconductor substrate 3-1 are not opened even in the case of the funnel-shaped opening edge regions being etched through.

The TEOS layer 3-4 can now be removed wet-chemically, so that the first horizontal mask 3-8a is reduced to form a thinner second horizontal mask 3-8b. The wet-chemical etching has been made possible by the method according to the invention, since the vertical masks protect in particular the pad oxide 3-1 against wet-chemical attacks and, consequently, prevent stripping of the nitride layer 3-3 from the semiconductor substrate 3-1.

After the removal of the TEOS oxide layer 3-4, the walls of the lower trench regions 3-10b are n-doped, preferably by a gas phase doping (GPD) method, e.g. with arsenic, in order thus to produce the first electrodes of the trench capacitors. The n-type doping has the effect that the first electrodes are electrically insulated from the p-doped semiconductor substrate and thus from the electronic switching elements that are to be applied on the surface of the semiconductor substrate. In practice, the trenches are packed so close together that the n-doped regions of adjacent trenches overlap and thus form an n-doped buried layer 3-12. Via the buried layer 3-12, the first electrodes of adjacent trench capacitors are then connected to one another in a low-impedance manner and thus put at a fixed reference potential.

FIG. 3E shows the trench capacitor after the lower trench regions 3-10b have been n-doped, additionally coated with a dielectric 3-19 and partly filled with polysilicon 3-20a. The dielectric 3-19 preferably contains an oxide layer, a nitride-oxide (NO) layer or an oxide-nitride-oxide (ONO) layer. These materials can be introduced reliably, i.e. with good insulation properties, even in trenches with a very large aspect ratio (trench depth to trench diameter). The polysilicon 3-20a is applied by standard methods and then removed by etching steps to an extent such that, on the one hand, it completely covers the dielectric 3-19 in the lower trench region 3-10b, but on the other hand leaves the upper trench region 3-10a largely open. Through the open upper trench region 3-10a, the vertical masks 3-11 can easily be removed later and replaced by new insulators with a lower dielectric constant.

FIG. 3F shows the trench capacitor after the dielectric 3-19 in the upper trench region 3-10a and the vertical masks 3-11 have been removed by etching, so that the sidewalls of the upper trench regions 3-10a are free for the application of an insulator, also called a collar. The insulator must be configured, in terms of layer thickness and material, in such a way that the threshold voltage $V_{thr}$ of the forthcoming parasitic transistor is so high that the parasitic transistor has sufficiently small leakage currents in its transistor channel during operation of the semiconductor component.

FIG. 3G shows the trench capacitor after the insulator layer has been applied and etched anisotropically in such a way that only the insulators 3-30 remain at the edge of the upper trench regions 3-10a. The insulator layer has been produced by thermal oxidation, which ensures a low-leakage-current junction between silicon and silicon oxide, and subsequent oxide deposition, which produces the required thickness of the insulator layer. The layer thickness of the insulators 3–30 is typically about 15–50 nm, so that the threshold voltage of the parasitic transistor is about 4 V.

Afterwards, the trench 3-10 is filled with upper polysilicon 3-20b and planarized in order that the second electrodes of the trench capacitors can be electrically conductively connected to the selection transistors that are yet to be produced.

FIG. 3H shows the trench capacitor after the production of a selection transistor 3-49 beside the trench capacitor and after the completion of the electrically conductive connection between the selection transistor 3-49 and the second electrode, which is provided by the lower polysilicon 3-20a. In this embodiment, the electrically conductive connection is composed of an electrically conductive strap 3-44 ("buried strap") and the upper polysilicon 3-20b. However, the type of the electrically conductive connections between the selection transistor 3-49 and the second electrode 3-20a can be achieved in diverse other ways according to the invention. For example, the "buried strap" can also be replaced by a "surface strap".

The selection transistors are produced according to one of the methods of the prior art. The electrically conductive strap 3-44 which connects a drain 3-40 of the selection transistor 3-49 to the second electrode 3-20a of the trench capacitors via the upper polysilicon 3-20b is also fabricated according to one of the methods of the prior art.

Furthermore, FIG. 3H shows, indicated by a broken line border, a region of the parasitic transistor 3-45 via which an electrically conductive connection can be produced between the buried layer 3-12 and the drain 3-40 of the selection transistor. However, since the insulators 3–30 have a layer thickness of about 30 nm and a relative permittivity of only 3.9 ($SiO_2$), the threshold voltage $V_{thr}$ lies above 3–4 V in the present embodiment. This is distinctly above the maximum voltages of 1.8–2.8 V that a trench capacitor sees during operation. The high quality of the lattice transition from the insulator 3-30 to the semiconductor substrate 3-1 furthermore provides for a minimization of the leakage currents of the parasitic transistors 3-45.

FIG. 4 shows a further embodiment of a trench capacitor that is produced by an advantageous embodiment of the method. In FIG. 4, in addition to the anisotropic etching for producing the lower trench regions, an isotropic etching step has been carried out, which extends the lower trench regions 3-10 and thus increases the capacitance of the trench capacitors. This embodiment has the advantage that this extension is not at the expense of the integration density of the memory cells, since the trench extensions are effected selectively only in the lower trench regions, where there is still free volume for extension since the memory cells on the surface of the semiconductor substrate, as a result of the selective transistor and insulation stripping, require more area than the trench capacitors in the semiconductor substrate. The method according to the invention can easily integrate an additional etching step for producing the extended lower trenches, since the vertical masks 3-11 permit separate treatment of lower and upper trench regions without any problems.

Figure 5:
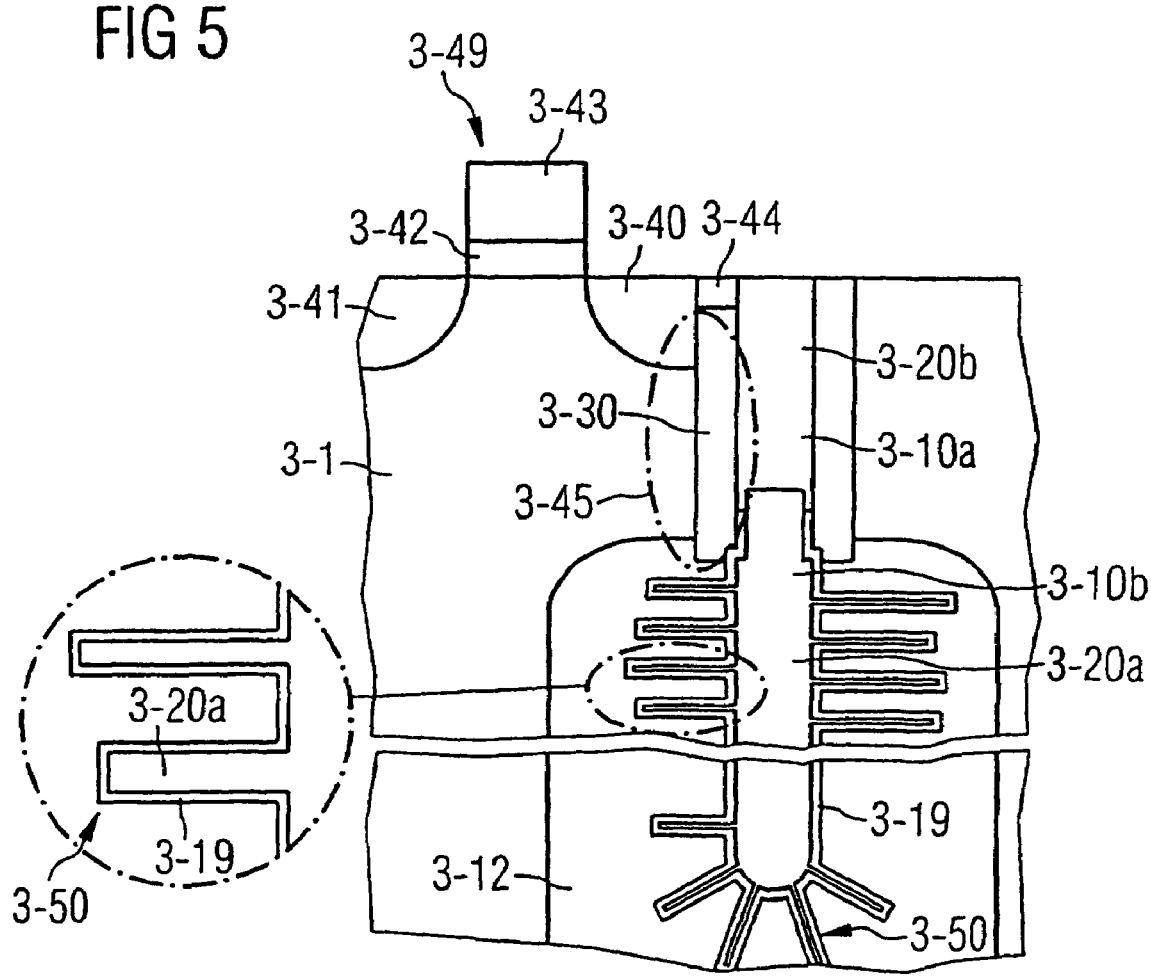
FIG. 5 is a diagrammatic, sectional view of the trench capacitor according to the invention with mesopores in the capacitor region.

FIG. 5 shows a further embodiment of a trench capacitor that is produced by an advantageous embodiment of the method. In FIG. 5, in addition to the anisotropic etching for producing the lower trench regions, an electrochemical etching step has been carried out, by which mesopores 3-50 have been produced in the walls of the lower trench regions. Mesopores 3-50 are channels that run in a woodworm-hole-like manner, have a size of about 2 nm to 50 nm and are produced during an electrochemical etching in n-doped silicon. The mesopores 3–50 thus produce a significant increase in the surface area of the lower trench regions 3–10b, which is utilized for enlarging the capacitor area (see enlargement detail in FIG. 5). Further details on the production of mesopores in n-doped silicon and their advantageous use for trench capacitors are described in Published, Non-Prosecuted German Patent Application DE 100 55 711 A1 by M. Goldbach. Mesopores in the lower trench regions have the advantage that the enlargement of the surface is not at the expense of the integration density of the memory cells, since the mesopores are effected selectively only in the lower trench regions, where there is still volume available for mesopores.

The method according to the invention can easily integrate an additional electrochemical etching step for producing mesopores since the vertical masks 3–11 permit separate treatment of lower and upper trench regions without any problems.

FIGS. 6A–6J show a further embodiment of the method according to the invention for fabricating trench capacitors for a memory cell, in this case "buried collars" being used for the electrical insulation of the second electrode from the semiconductor substrate.

The following method is suitable in particular for very large-scale integrated memory cells in which the trench diameters are less than 300 nm and preferably less than 100 nm. In this case, the aspect ratio of these trenches is preferably greater than 30, preferably greater than 40 and furthermore preferably greater than 50, so that the trench depths typically lie in the range between 4 µm and 10 µm.

Figure 6A:
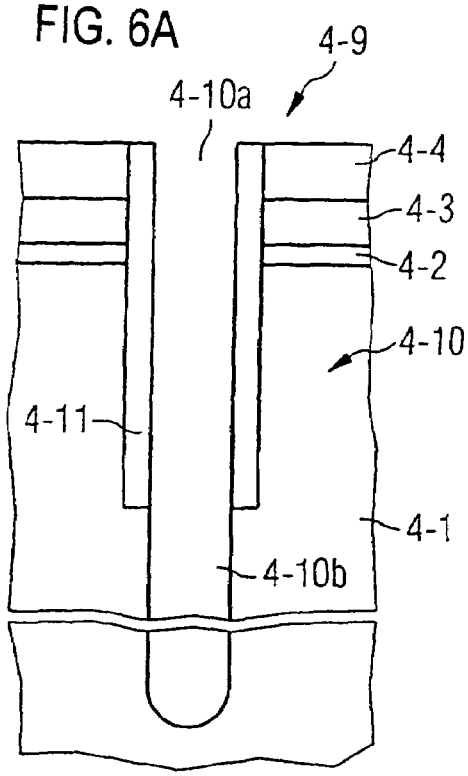

The first process steps for producing trenches 4-10 with upper trench regions 4-10a and lower trench regions 4-10b are analogous to the process steps shown in FIGS. 3A to 3D. As in FIG. 3D, FIG. 6A shows a layer stack patterned with mask openings 4-9 on a semiconductor substrate 4-1, the layer stack being composed of a pad oxide 4-2, a nitride layer 4-3 and a hard mask layer 4-4 in the present embodiment. In the present embodiment, the material of the hard mask 4-4 is an oxide and preferably a TEOS oxide or a silane oxide. The hard mask 4-4 corresponds to the horizontal mask mentioned in the claims.

Figure 3C:
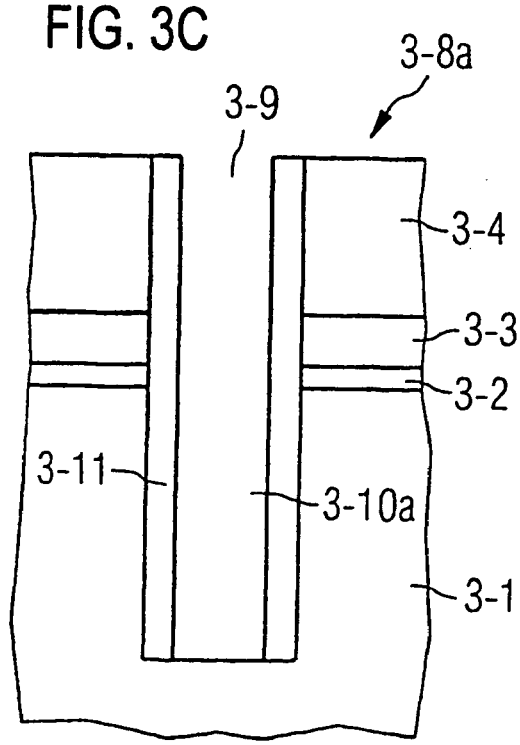
Figure 3D:
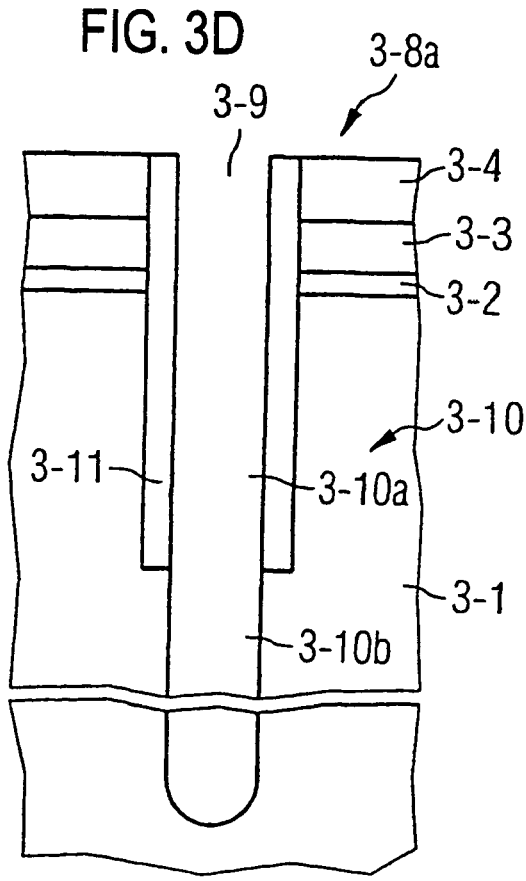

FIG. 6A furthermore shows a trench 4-10, which has been produced by anisotropic etchings as described in FIGS. 3B to 3D. In a first anisotropic etching, first the upper trench region 4-10a is produced in the silicon substrate 4-1 with a depth of typically 1 µm to 1.5 µm. After the production of a vertical mask 4-11 ("first liner"), which preferably contains a silicon oxide/nitride double layer having a thickness of 10 nm to 15 nm, the lower trench region 4-10b is produced by anisotropic etching, so that a total trench depth of approximately 7 µm results in this embodiment. Afterwards, an isotropic etching is carried out selectively with respect to the hard mask 4-4 and selectively with respect to the vertical mask 4-11, e.g. by a wet-chemical process using $NH_4OH$, thereby widening the lower trench region 4-10b.

Figure 6B:
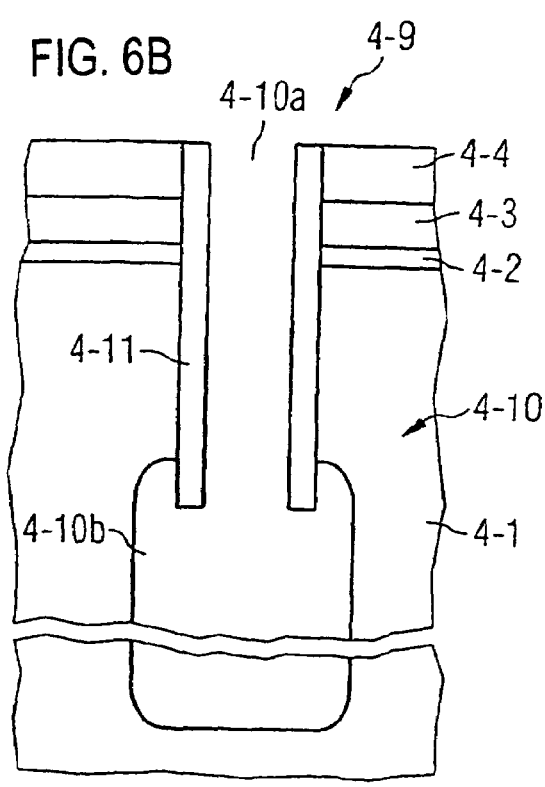

FIG. 6B shows one of the trenches 4–10 after the isotropic etching of the silicon, so that the lower trench region has been widened laterally and longitudinally. The isotropic etching thus produces a "bottle-like" trench form profile ("wet bottle") which has a bottle body with the lower trench region 4-10b and a bottle neck with the upper trench region 4-10b. Widening in the lower trench region 4-10b is only one of the possible measures for providing a larger trench wall area for producing the largest possible capacitances. Other process-compatible methods for enlarging the trench wall surfaces in the lower trench region, such as the published methods for producing mesopores or the use of hemispherical grain (HSG) can be used as an alternative or in addition.

Figure 6C:
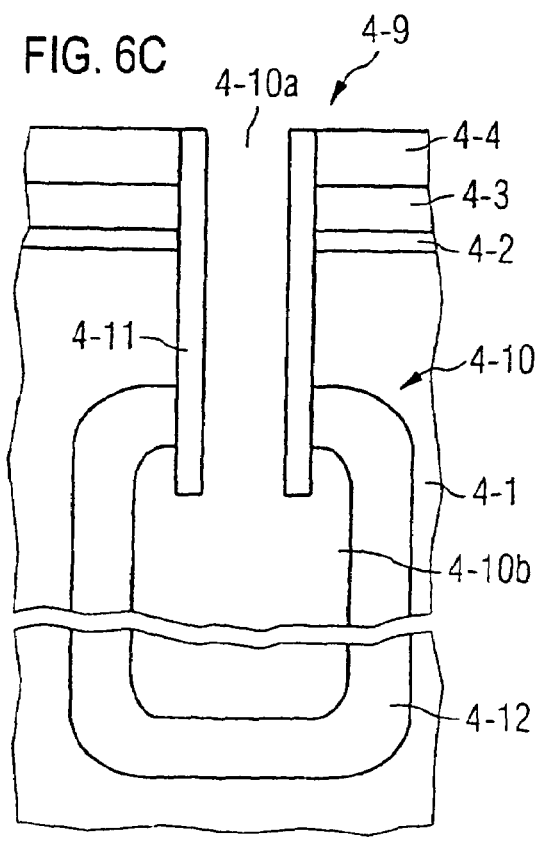

FIG. 6C shows the trench 4-10 after the gas phase doping (GPD) process, e.g. using arsenic, which, as described in FIG. 3E, provides the trench walls in the lower trench region 4-10b with a doping of about $10^{19}$ $1/cm^3$. The doping represents a first electrode 4-12 of the trench capacitors to be produced. The trench capacitors are preferably disposed so close together that the adjacent n-doped zones merge with one another. As a result, the mutually superposed n-doped zones together form a low-impedance buried layer in the semiconductor substrate 4-1.

Figure 6D:
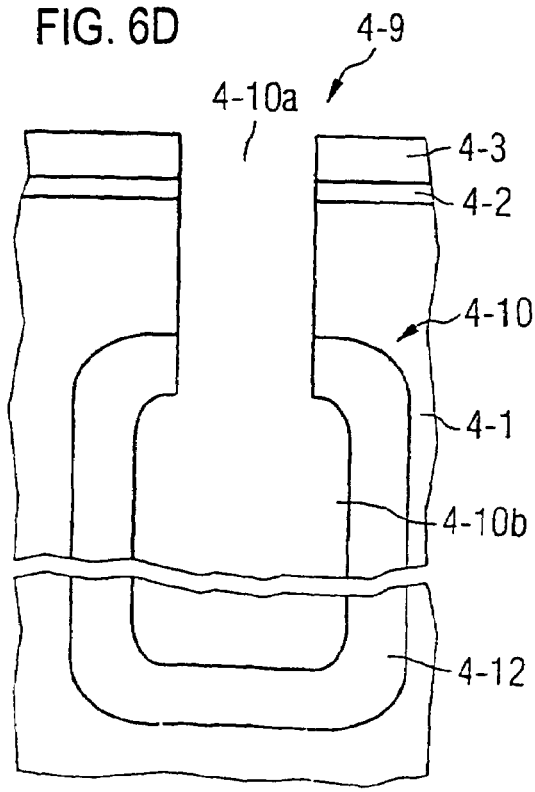

FIG. 6D shows the trench 4-10 after the vertical mask 4-11 has been removed wet-chemically using HF glycol. In addition, the hard mask 4-4 (horizontal mask) has been removed, e.g. by etching using BHF.

Figure 6E:
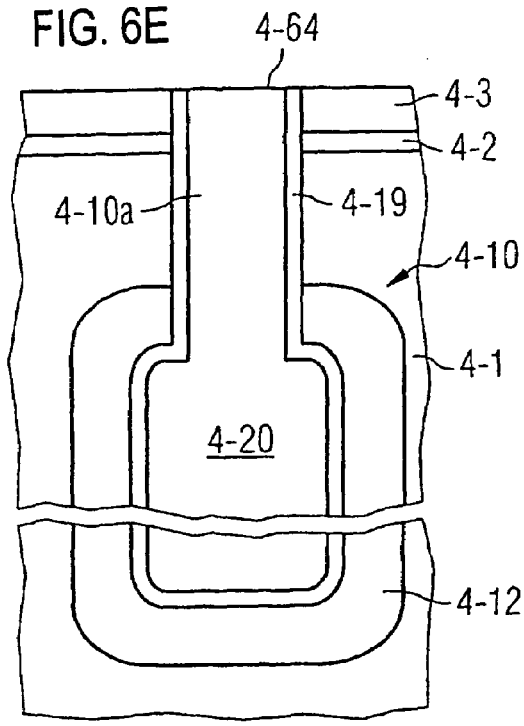

FIG. 6E shows the trench capacitor 4-10 after a dielectric 4-19 has been deposited. The dielectric 4-19 is typically a nitride/oxide layer with a thickness of typically 5 nm, as has already been described in FIG. 3E. Other dielectrics containing e.g. oxide-nitride-oxide, nitride-oxide, oxide, $Al_2O_3$, $Ta_2O_5$, a layer containing $Al_2O_3$, or layer combinations can also be used. After the deposition of the dielectric 4-19, the trench is filled further with a conductive material, preferably doped polysilicon. The polysilicon thus represents a second electrode 4-20 of the trench capacitor, the capacitor being formed by the first electrode 4-12, the dielectric 4-19 and the polysilicon of the second electrode 4-20. Furthermore, a CMP planarization step preferably follows, which removes the polysilicon of the second electrode 4-20 and the dielectric 4-19 on the nitride layer 4-3.

The upper trench regions 4-10a are subsequently processed. Since the lower trench regions 4-10b are largely protected mechanically and chemically from the semiconductor substrate surface by the filling with the polysilicon 4-20, the process steps for configuring the upper trench regions 4-10a can be carried out largely independently of the state of the lower trench regions 4-10b.

Figure 6F:
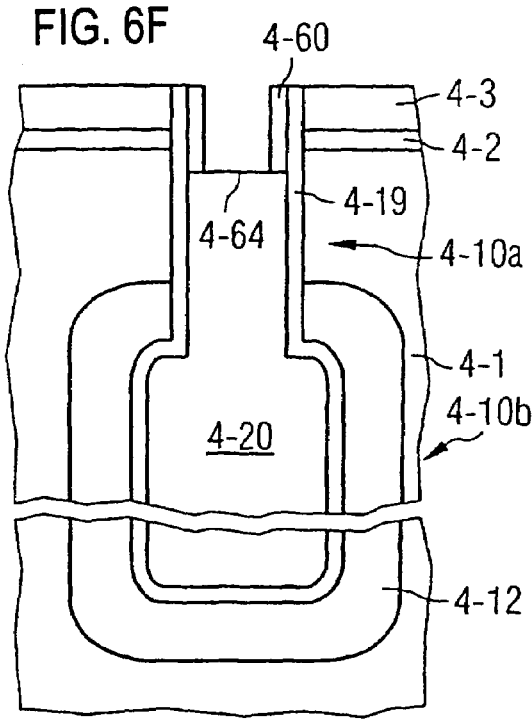

FIG. 6F shows an enlarged detail of the upper trench region 4-10a after the polysilicon of the second electrode 4-20 has been etched back in a first etching-back step, preferably by a standard isotropic dry etching, so that the electrode surface 4-64 is lowered to about 200–500 nm below the silicon upper edge ("first etching-back step"). Afterwards, a second liner 4-60 having a thickness of about 10 nm and preferably made of nitride has been deposited conformally and opened in the lower horizontal region in a further anisotropic dry etching step. As a result of the anisotropic etching, the second liner 4-60 remains only on the perpendicular trench walls above the second electrode surface 4-64.

Figure 6G:
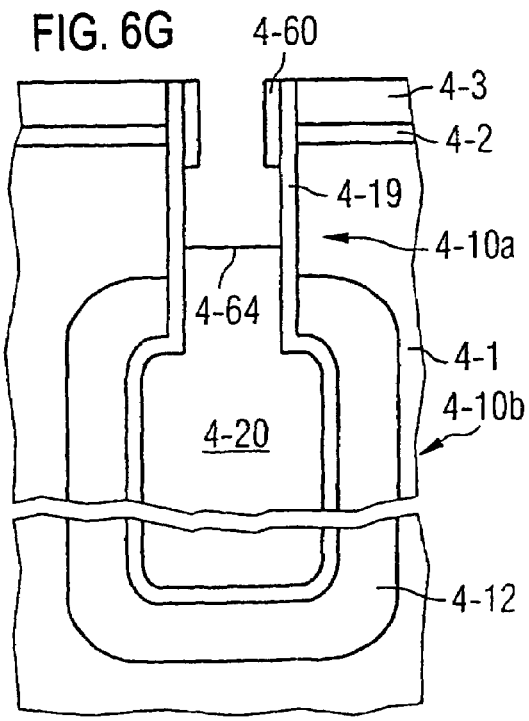

FIG. 6G shows the upper trench region 4-10a after the polysilicon of the second electrode 4-20 has been etched back in a second etching-back step, so that the second electrode surface 4-64 is lowered by a further 500 nm to 1000 nm ("second etching-back step").

Figure 6H:
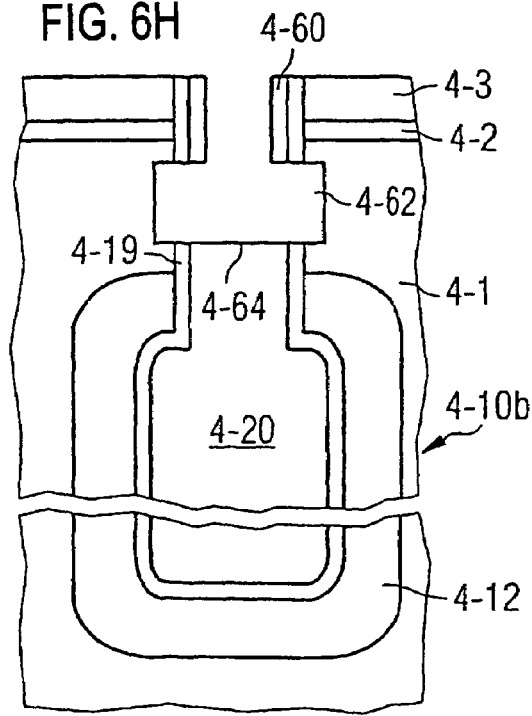

FIG. 6H shows the upper trench region 4-10a after the etching step that removes the dielectric 4-19 selectively with respect to the second liner 4-60. The dielectric 4-19 is preferably etched using HF glycol. The semiconductor substrate 4-1 is thus open in the upper trench region between the first etching-back step and the second etching-back step for etching the semiconductor substrate in the upper trench region.

There then follows the etching step in the upper trench region 4-10a selectively with respect to the second liner 4-60, which etches the silicon down to a depth of about 10 to 25 nm, so that the diameter is correspondingly increased in part of the upper trench region 4-10a. The increased diameter can subsequently be used for the placement of a sufficiently thick insulator layer 4-62, in particular for a "buried collar". The etching of the silicon in the upper trench region selectively with respect to the second liner 4-60 can be etched both isotropically and anisotropically.

FIG. 6I shows the upper trench region 4-10a after a buried insulator 4-62 ("buried collar") has been deposited on the etched silicon by a LPCVD or PECVD deposition. The thickness of the layer of the buried insulator is preferably not thicker than the depth of the etching, so that the buried collars 4-62 do not project or project only insignificantly over the adjoining trench walls. In this way, a buried collar does not impede the filling of the upper trench region with e.g. polysilicon. At the same time, the buried collar may be thick enough to suppress a current flow along the trench bottle neck, which corresponds to the channel of the said parasitic transistor, during memory operation.

FIG. 6J shows the trench capacitor after the second liner 4-60 and the dielectric 4-19 have been removed in the upper trench region 4-10a by an etching step using HF glycol and the trench 4-10 has been completely filled with polysilicon. After a planarization step, the second electrode surface 4-64 is thus again at the surface of the semiconductor substrate 4-1.

The further steps for fabricating an electrically conductive connection to the read-out transistor, e.g. with a surface strap or with a "buried strap", are known to the person skilled in the art and are not explained any further here.

As an alternative to the method shown in FIGS. 6A–6J, after the first etching-back of the polysilicon which forms the second electrode 4-20, the dielectric 4-19 is removed in the etched-back region. In this case, the second liner 4-60 is applied directly to the trench wall (see FIG. 7A). The further steps for producing the buried collar are analogous to the steps shown in FIGS. 6G to 6H, so that a trench structure as shown in FIG. 7B is then obtained.

Afterwards, the second liner 4-60 is removed using HF glycol, an electrically conductive connection to the selection transistor is produced according to one of the known methods, e.g. by a "buried strap" or "surface strap", and the trench, as shown in FIG. 7C, is filled with polysilicon as far as the trench upper edge 4-64.

As an alternative to the embodiments set forth in FIGS. 6A–6J and FIGS. 7A–7C, it is possible, if the dielectric 4-19 is a nitride/oxide layer ("NO layer"), for the nitride/oxide layer regions uncovered after the first etching-back of the polysilicon to be converted into an oxide layer. This is preferably done by the ISSG method. By virtue of the conversion of the NO layer into an oxide layer, it is not necessary to subsequently apply a second liner layer 4-60 (see FIG. 6F) for fabricating buried collars, since the converted oxide layer can be used as masking for fabricating the buried collars. Furthermore, it is advantageous that the subsequent removal of the oxide layer is simpler to carry out than that of a nitride layer. The process step sequence after the fabrication of the converted oxide layer is therefore identical to the process step sequence illustrated in FIGS. 6G–6J.

A further advantageous variation of a process sequence consists in removing the hard mask 4-4 only after the first process of filling the trench 4-10, e.g. with polysilicon or another conductive material. The filling of the trenches results in that the walls of the trenches 4-10 are not damaged or attacked by the etching of the hard mask 4-4. The hard mask 4-4 is preferably removed after the filling of the trenches 4–10 (e.g. with polysilicon) and before the first etching-back of the polysilicon 4-20.

In a further preferred variation of the process sequence, the hard mask 4-4 is removed only after the second process of filling the trenches 4-10 with the material of the second electrodes 4-20, in particular with polysilicon. The hard mask 4-4 is thus removed after the production of the buried collars 4-62. This entails the advantage that the hard mask protects the underlying nitride layer for as long as possible for the production of "shallow trenches", i.e. for the shallow trenches for isolating adjacent circuits, later in the method.

We claim:

1. A method for fabricating trench capacitors for memory cells having at least one selection transistor for integrated semiconductor memories, which comprises the steps of:
    providing a semiconductor substrate of a first conductivity type;
    producing a horizontal mask on the semiconductor substrate, the horizontal mask to be used for producing trenches;
    carrying out an anisotropic etching step after a completion of the horizontal mask, thereby producing upper trench regions in the semiconductor substrate;
    covering sidewalls of the upper trench regions with vertical masks;
    etching the semiconductor substrate selectively with respect to the horizontal mask and the vertical masks, for producing lower trench regions;
    doping surfaces of the lower trench regions with a material of a second conductivity type resulting in first electrodes being produced on surfaces of the lower trench regions;
    applying a dielectric to the first electrodes;
    removing the vertical masks;
    applying second electrodes to the dielectric resulting in the trench capacitors being formed in the lower trench regions;
    etching the semiconductor substrate in the upper trench regions after an application of the second electrodes;
    producing an insulator on a region etched in each of the upper trench regions; and
    producing electrically conductive connections each connecting a respective one of the second electrodes to a respective selection transistor.

2. The method according to claim 1, which further comprises forming the semiconductor substrate from one of silicon and p-doped silicon.

3. The method according to claim 1, which further comprises producing the horizontal mask as a layer stack using a photolithographic process.

4. The method according to claim 3, which further comprises forming the layer stack to have at least one of a nitride layer and an oxide layer.

5. The method according to claim 1, which further comprises affecting the anisotropic etching of the semiconductor substrate using a dry etching process.

6. The method according to claim 1, which further comprises forming the upper trench regions in each case to project into the semiconductor substrate to a depth of about 500 nm to 1500 nm.

7. The method according to claim 1, which further comprises producing the vertical masks by conformally depositing a covering layer and subsequent anisotropic etching the covering layer.

8. The method according to claim 7, which further comprises forming the covering layer from at least one material selected from the group consisting of nitrides and oxides.

9. The method according to claim 1, which further comprises producing the lower trench regions by anisotropic etching.

10. The method according to claim 9, which further comprises enlarging a surface of the lower trench regions by isotropic etching.

11. The method according to claim 1, which further comprises forming the trenches to have a depth of about 5 μm to 15 μm.

12. The method according to claim 1, which further comprises enlarging a surface of the lower trench regions by producing mesopores in a manner subsequent to the etching of the lower trench regions.

13. The method according to claim 1, wherein the doping of the lower trench regions connects the first electrodes of adjacent trenches to one another in a low-impedance manner.

14. The method according to claim 1, wherein the dielectric completely covers the first electrodes in the lower trench regions.

15. The method according to claim 1, which further comprises forming the dielectric as a layer selected from the group consisting of an oxide-nitride-oxide layer, a nitride-oxide layer, an oxide layer, an $Al_2O_3$ layer, a $Ta_2O_5$ layer, a hafnium oxide layer, a layer containing $Al_2O_3$, and a combination of these layers.

16. The method according to claim 15, which further comprises converting the nitride-oxide layer into an oxide layer in the upper trench regions.

17. The method according to claim 1, which further comprises producing the second electrodes by filling the trenches with a conductive material as far as the upper trench regions.

18. The method according to claim 17, which further comprises using doped polysilicon as the conductive material for forming the second electrodes.

19. The method according to claim 1, which further comprises replacing the vertical masks with the insulators having a low dielectric constant after a production of the second electrodes.

20. The method according to claim 19, which further comprises forming the insulators from silicon oxide.

21. The method according to claim 19, which further comprises forming the insulators with a predetermined layer thickness.

22. The method according to claim 1, which further comprises electrically conductively connecting each of the second electrodes of the trench capacitors to a diffusion location of the respective selection transistor.

23. The method according to claim 1, which further comprises removing the horizontal mask.

24. The method according to claim 1, which further comprises removing the vertical masks before applying the dielectric.

25. The method according to claim 1, which further comprises removing the dielectric in the upper trench regions.

26. The method according to claim 1, which further comprises producing the insulators on the semiconductor substrate in the upper trench regions after removing the vertical masks.

27. The method according to claim 1, which further comprises:
   forming a liner in the upper trench regions; and
   etching selectively the semiconductor substrate with respect to the liner in the upper trench regions after applying the second electrodes.

28. The method according claim 27, which further comprises applying the liner to one of the dielectric and the semiconductor substrate.

29. The method according to claim 27, which further comprises:
   applying the liner to the dielectric; and
   converting the liner into an oxide.

30. The method according to claim 1, which further comprises during the etching in the upper trench regions, opening the semiconductor substrate with an aid of double etching-back of the second electrodes.

31. The method according to claim 1, which further comprises performing the following steps after an application of the dielectric:
   filling the trenches with a material forming the second electrodes;
   etching-back the material forming the second electrodes as far as a first etching-back step within the upper trench regions;
   covering trench walls above the first etching-back step with a liner;
   etching-back the material forming the second electrodes as far as a second etching-back step; and
   opening the semiconductor substrate selectively with respect to the liner.

\* \* \* \* \*